US008804778B2

(12) United States Patent
Wakabayashi et al.

(10) Patent No.: US 8,804,778 B2
(45) Date of Patent: *Aug. 12, 2014

(54) LASER APPARATUS AND EXTREME ULTRAVIOLET LIGHT SOURCE APPARATUS

(75) Inventors: Osamu Wakabayashi, Hiratsuka (JP); Akira Endo, Jena (DE); Krzysztof Nowak, Oyama (JP); Takashi Suganuma, Yuki (JP); Masato Moriya, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/580,523

(22) Filed: Oct. 16, 2009

(65) Prior Publication Data

US 2010/0193710 A1   Aug. 5, 2010

(30) Foreign Application Priority Data

Oct. 16, 2008  (JP) .................................. 2008-267519
Dec. 26, 2008  (JP) .................................. 2008-334007
Sep. 11, 2009  (JP) .................................. 2009-211072

(51) Int. Cl.
     *H01S 3/10*       (2006.01)
(52) U.S. Cl.
     USPC ................................ 372/20; 372/75; 372/102
(58) Field of Classification Search
     CPC ............. H01S 3/0405; H01S 3/08009; H01S 3/08022; H01S 3/0812; H01S 3/082; H01S 3/0826; H01S 3/1028; H01S 3/2308; H01S 5/02415; H01S 5/3401; H01S 5/5027
     USPC ............................................ 372/20, 75, 102
     See application file for complete search history.

(56) References Cited

U.S. PATENT DOCUMENTS

| 5,444,724 A | 8/1995 | Goto |
| 5,982,794 A | 11/1999 | Tamura |
| 6,421,363 B1 * | 7/2002 | Osinski et al. ............. 372/50.11 |
| 7,067,832 B2 | 6/2006 | Mizoguchi et al. |

(Continued)

FOREIGN PATENT DOCUMENTS

| JP | 59-170815 A | 9/1984 |
| JP | 07-066482 A | 3/1995 |

(Continued)

OTHER PUBLICATIONS

Japanese Notification of Reasons for Refusal, w/ English translation thereof, issued in Japanese Patent Application No. JP 2009-211072 dated Aug. 27, 2013.

*Primary Examiner* — Yuanda Zhang
(74) *Attorney, Agent, or Firm* — McDermott Will & Emery LLP

(57) ABSTRACT

An extreme ultraviolet light source apparatus comprises a laser apparatus having a master oscillator outputting one or more longitudinal-mode-laser lights, an amplifier with a molecular gas as an amplifying agency amplifying a longitudinal-mode laser light of which wavelength is included in one of amplifiable lines, and a controller adjusting the master oscillator so that the wavelength of the longitudinal-mode laser light outputted from the master oscillator is included in one of the amplifiable lines, the laser apparatus being used as a driver laser, wherein the laser apparatus irradiates a target material with a laser light for generating plasma, and the extreme ultraviolet light is emitted from the plasma and outputted from the extreme ultraviolet light source apparatus.

10 Claims, 22 Drawing Sheets

(56) References Cited

U.S. PATENT DOCUMENTS

| | | |
|---|---|---|
| 7,139,450 B2 | 11/2006 | Khayim et al. |
| 7,386,018 B2 | 6/2008 | Mori et al. |
| 2002/0136245 A1* | 9/2002 | Pang .............................. 372/20 |
| 2003/0219054 A1* | 11/2003 | Capasso et al. ................ 372/50 |
| 2004/0013352 A1* | 1/2004 | Khayim et al. ................ 385/24 |
| 2005/0205810 A1 | 9/2005 | Akins et al. |
| 2005/0205811 A1 | 9/2005 | Partlo et al. |
| 2006/0078017 A1* | 4/2006 | Endo et al. ................ 372/38.02 |
| 2006/0120422 A1 | 6/2006 | Yamanishi et al. |
| 2007/0001131 A1 | 1/2007 | Ershov et al. |
| 2007/0030865 A1 | 2/2007 | Day et al. |
| 2008/0013163 A1* | 1/2008 | Leonardo et al. ........ 359/341.31 |
| 2008/0149862 A1* | 6/2008 | Hansson et al. ........... 250/504 R |
| 2008/0198891 A1* | 8/2008 | Hori et al. ........................ 372/61 |
| 2008/0225904 A1* | 9/2008 | Brown et al. ................... 372/22 |
| 2008/0304524 A1* | 12/2008 | Marsland et al. ........ 372/29.011 |

FOREIGN PATENT DOCUMENTS

| | | |
|---|---|---|
| JP | 10-178240 A | 6/1998 |
| JP | 10-200178 A | 7/1998 |
| JP | 11-068248 A | 3/1999 |
| JP | 2000-332322 A | 11/2000 |
| JP | 2002-076503 A | 3/2002 |
| JP | 2003-297737 A | 10/2003 |
| JP | 2003-332678 A | 11/2003 |
| JP | 2005-251810 | 9/2005 |
| JP | 2006-135298 | 5/2006 |
| JP | 2006-140425 A | 6/2006 |
| JP | 2007-529903 A | 10/2007 |
| WO | 2005076422 A1 | 8/2005 |
| WO | 2008088488 A1 | 7/2008 |

* cited by examiner

| TRANSITION 00°1-10°0 BAND | WAVELENGTH IN VACUUM [μm] | WAVELENGTH DIFFERENCE BETWEEN EACH LINE [μm] |
|---|---|---|
| P [12] | 10.5135 | 0.0191 |
| P [14] | 10.5326 | 0.0192 |
| P [16] | 10.5518 | 0.0195 |
| P [18] | 10.5713 | 0.0199 |
| P [20] | 10.5912 | 0.0206 |
| P [22] | 10.6118 | 0.0206 |
| P [24] | 10.6324 | 0.021 |
| P [26] | 10.6534 | 0.0214 |
| P [28] | 10.6748 | 0.0217 |
| P [30] | 10.6965 | 0.0229 |
| P [32] | 10.7194 | 0.0221 |
| P [34] | 10.7415 | 0.0233 |
| P [36] | 10.7648 | 0.0232 |
| P [38] | 10.788 | |
| TRANSITION 00°1-02°0 BAND | WAVELENGTH IN VACUUM [μm] | WAVELENGTH DIFFERENCE BETWEEN EACH LINE [μm] |
| P [22] | 9.5691 | 0.0171 |
| P [24] | 9.5862 | 0.0201 |
| P [26] | 9.6063 | 0.0148 |
| P [28] | 9.6211 | 0.018 |
| P [30] | 9.6391 | 0.0185 |
| P [32] | 9.6576 | 0.0186 |
| P [34] | 9.6762 | |

LASER APPARATUS AND EXTREME ULTRAVIOLET LIGHT SOURCE APPARATUS

CROSS-REFERENCE TO RELATED APPLICATIONS

This application is based upon and claims the benefit of priority from the prior Japanese Patent Applications No. 2008-267519, filed on Oct. 16, 2008, No. 2008-334007, filed on Dec. 26, 2008, and No. 2009-211072, filed on Sep. 11, 2009; the entire contents of which are incorporated herein by reference.

BACKGROUND OF THE INVENTION

1. Field of the Invention

The present invention relates to a laser apparatus as being a driver laser for an extreme ultraviolet light source apparatus used for an exposure apparatus and an extreme ultraviolet light source apparatus using such laser apparatus.

2. Description of the Related Art

In recent years, along with a progress in a miniaturization of semiconductor device, miniaturization of transcription pattern used in photolithography in semiconductor process has developed rapidly. In the next generation, microfabrication to the extent of 70 nm to 45 nm, or even to the extent of 32 nm and beyond will be required. Therefore, in order to comply with the demand of microfabrication to the extent of 32 nm and beyond, development of such on exposure apparatus combining an extreme ultraviolet (EUV) light source for a wavelength about 13 nm and a reflection-type reduction projection optical system is expected.

As the EUV light source, there are three possible types, which are a laser produced plasma (LPP) light source using plasma generated by irradiating a target with a laser beam, a discharge produced plasma (DPP) light source using plasma generated by electrical discharge, and a synchrotron radiation (SR) light source using orbital radiant light. Among these light sources, the LPP light source has the advantage of obtaining extremely high optical intensity close to the blackbody radiation because plasma density can be made higher than the DPP light source and the SR light source. Moreover, the LPP light source has the advantage of obtaining a strong light with a desired wavelength band by selecting a target material. Furthermore, the LPP light source is a point light source which has no electrode located around a luminous point and has a nearly isotropic angular distributions. Therefore, extremely wide collecting solid angle can be acquired. The LPP light source with the above-mentioned advantages has attracted attention as a light source for EUV lithography which requires more than several dozen to several hundred watt power.

In the EUV light source apparatus with the LPP system, firstly, a target material supplied inside a vacuum chamber is irradiated with a laser light to be ionized and thus generate plasma. Then, a cocktail light with various wavelength components including an EUV light is emitted from the generated plasma. The EUV light source apparatus collects the EUV light by reflecting the EUV light using an EUV collector mirror which selectively reflects the EUV light with a desired wavelength component, such as a 13.5 nm wavelength component, for instance. The collected EUV light enters an exposure apparatus. On a reflective surface of the EUV collector mirror, a multilayer coating, with a structure in that thin coatings of molybdenum (Mo) and thin coatings of silicon (Si) are alternately stacked, for instance, is formed. The multilayer coating has a high reflectance ratio (of about 60% to 70%) for the EUV light with a 13.5 nm wavelength.

US patent application Laid-Open No. 2007/1131 (hereinafter to be referred to as patent reference 1) discloses a driver laser for an EUV light source apparatus with the LPP system. Specifically, this driver laser is in a MOPA (master oscillator and power amplifier) system using a $CO_2$ gas laser. The driver laser with the MOPA system amplifies a light from a master oscillator (MO), which outputs a pulse laser light, using three power amplifiers.

Moreover, Japanese patent application Laid-Open No. 2006-135298 (hereinafter to be referred to as patent reference 2) discloses a driver laser for an EUV light source apparatus with the LPP system. This driver laser uses a $CO_2$ gas laser as an MO. In a $CO_2$ gas laser which normally oscillates, oscillating lines will be concentrated in P(20). On the other hand, the driver laser disclosed in the patent reference 2 prevents the oscillating lines from being concentrated in the P(20) by inserting a wavelength selecting element into a resonator of the $CO_2$ gas laser. Moreover, patent reference 2 discloses a driver laser having a structure in that a solid laser and two nonlinear crystals transforming a light from the solid laser into a light with a broad wavelength distribution of around 10.6 μm are used as an MO. In this driver laser, a light from the MO is amplified by an amplifier using $CO_2$ gas as an amplifying agency.

Furthermore, US patent application Laid-Open No. 2007/30865 (hereinafter to be referred to as patent reference 3) discloses a middle-infrared ray (MIR) laser for mainly measuring concentration of gas in the atmosphere with high accuracy. This MIR laser uses a quantum cascade laser as a wavelength tunable semiconductor laser for middle-infrared band.

However, it is a problem that the use of the $CO_2$ gas laser being a high power molecular laser as an MO for the same type of the $CO_2$ gas laser will make the structure of a controller such as a pulse controller complicated, and moreover, will make handling of the controller more difficult.

On the other hand, in a case where a laser light from the solid laser is transformed using the nonlinear crystal, or the like, and the transformed laser light is amplified using the $CO_2$ gas laser, in order to improve the amplification efficiency, it is required that a wavelength of the light outputted from the nonlinear crystal is adjusted to an amplifiable line of the $CO_2$ gas laser. However, a light with a wavelength matching up with an amplifiable line of a molecular gas laser such as the $CO_2$ gas laser is difficult to generate by a disparate laser apparatus such as a solid laser combined with a nonlinear crystal.

BRIEF SUMMARY OF THE INVENTION

It is therefore an object of the present invention to resolve the above-described problems and to provide a laser apparatus and an extreme ultraviolet light source apparatus which make possible to not only achieve easy handling of the master oscillator, but also amplify the single/multiple-longitudinal-mode laser light outputted from the master oscillator with high efficiency, even when the molecular gas laser such as the $CO_2$ gas laser is used as the amplifying laser.

In accordance with one aspect of the present invention, a laser apparatus comprises a master oscillator outputting one or more longitudinal-mode laser lights, an amplifier with a molecular gas as an amplifying agency amplifying a longitudinal-mode laser light of which wavelength is included in one of amplifiable lines, and a controller adjusting the master oscillator so that the wavelength of the longitudinal-mode laser light outputted from the master oscillator is included in one of the amplifiable lines.

In accordance with another aspect of the present invention, an extreme ultraviolet light source apparatus comprises a laser apparatus having a master oscillator outputting one or more longitudinal-mode laser lights, an amplifier with a molecular gas as an amplifying agency amplifying a longitudinal-mode laser light of which wavelength is included in one of amplifiable lines, and a controller adjusting the master oscillator so that the wavelength of the longitudinal-mode laser light outputted from the master oscillator is included in one of the amplifiable lines, the laser apparatus being used as a driver laser, wherein the laser apparatus irradiates a target material with a laser light for generating plasma, and the extreme ultraviolet light is emitted from the plasma and outputted from the extreme ultraviolet light source apparatus.

These and other objects, features, aspects, and advantages of the present invention will become apparent to those skilled in the art from the following detailed description, which, taken in conjunction with the annexed drawings, discloses preferred embodiments of the present invention.

DETAILED DESCRIPTION OF THE INVENTION

Exemplary embodiments of a laser apparatus and an extreme ultraviolet light source apparatus according to the present invention will be described below in detail with reference to the accompanying drawings. The present invention is not limited to the following embodiments.

First Embodiment

Figure 1:
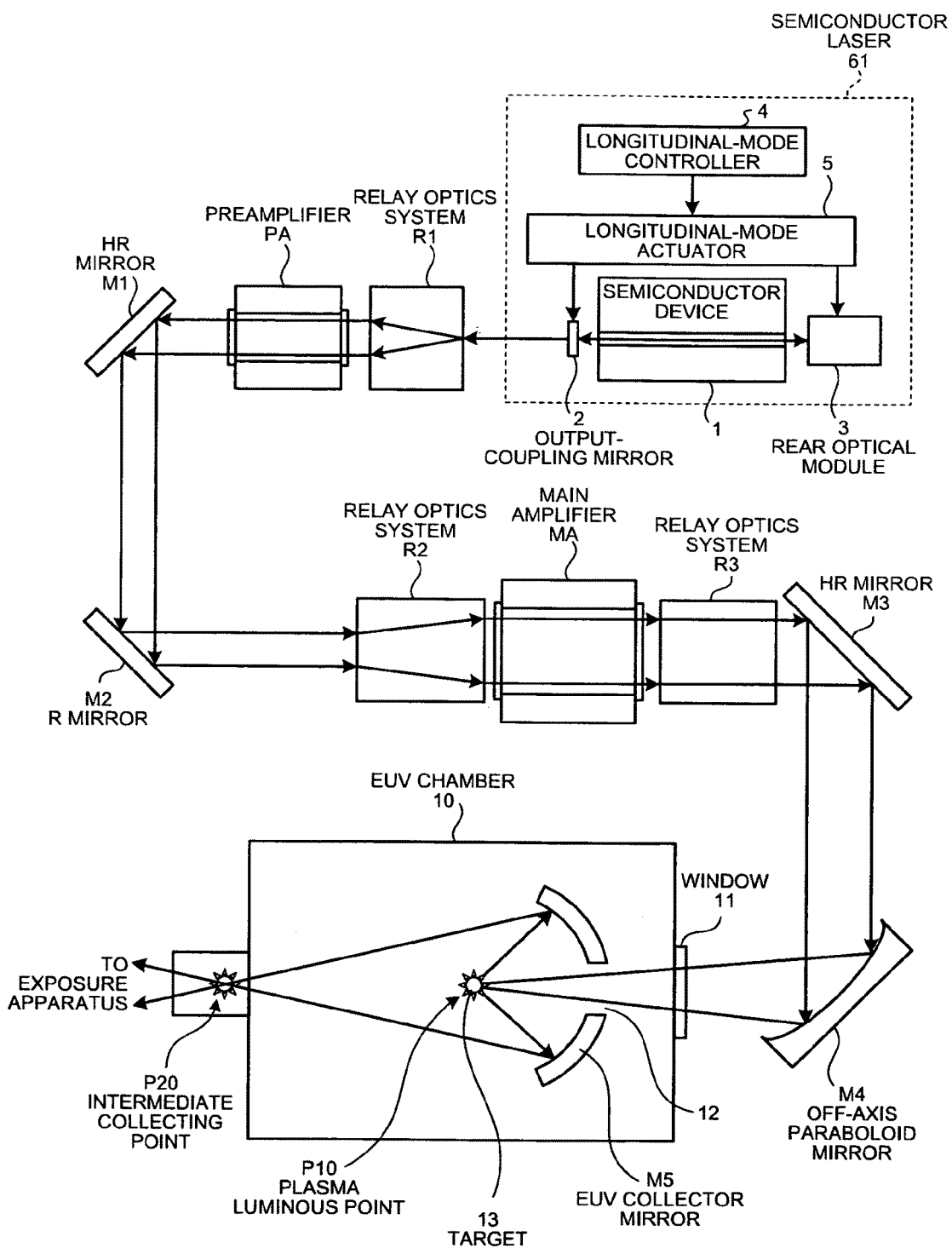
FIG. 1 is a block diagram showing a structure of an extreme ultraviolet light source apparatus according to a first embodiment of the present invention.

FIG. 1 is a schematic diagram showing a structure of an extreme ultraviolet light source (EUV) apparatus having a laser apparatus according to a first embodiment of the present invention. This EUV apparatus comprises, as main components, a driver laser which outputs laser lights (so-called seed laser lights) for exciting target materials which are generation sources of EUV light, and an EUV generator which generates the EUV light using the laser lights from the driver laser. The driver laser includes a semiconductor-laser 61 which is a master oscillator, and a multi-stage amplifier which is a double-stage amplifier constituted from a preamplifier PA and a main amplifier MA. Both of the preamplifier PA and the main amplifier MA have mixed gases including $CO_2$ gas as as an amplifying agency.

The semiconductor laser 61 has a semiconductor device 1, an output-coupling mirror 2, a rear optical-module 3, a longitudinal-mode actuator 5, and a longitudinal-mode controller 4. The semiconductor device 1 amplifies one or more laser lights by oscillating in a longitudinal-mode with such wavelengths that correspond to one or more amplifiable lines of the preamplifier PA and the main amplifier MA. This semiconductor device 1 is a semiconductor laser, which optimally is a quantum-cascade laser. At a front side (also called a light pickup side) of the semiconductor device 1, the output-coupling mirror 2 is located. At a rear side (also called a back side) of the semiconductor device 1, the rear optical module 3 is located. Between the output-coupling mirror 2 and the rear optical module 3 sandwiching the semiconductor device 1 in between, an optical resonator (hereinafter to be simply referred to as resonator) 601 is formed (shown in FIG. 2). A resonator length of this resonator 601 can be controlled by moving the output-coupling mirror 2 and/or the rear optical module 3 using the longitudinal-mode actuator 5 which drives under control of the longitudinal-mode controller 4.

Figures 2, 3:
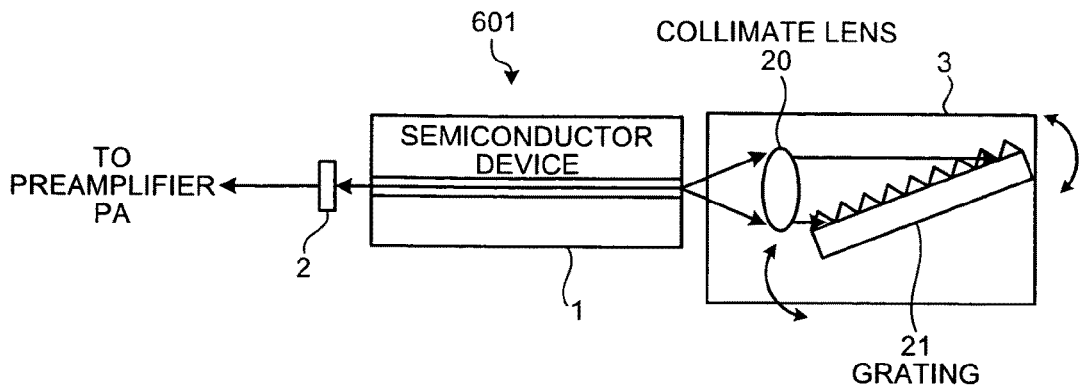
FIG. 2 is a schematic diagram showing an example of a semiconductor laser according to the first embodiment of the present invention.
FIG. 3 is an image showing a correspondence table of a relationship between oscillation bands and wavelength of a $CO_2$ gas laser according to the first embodiment of the present invention.

The output-coupling mirror 2 is a mirror with a partial reflection mirror coating applied. This output-coupling mirror 2 functions as an optical pickup window for picking up a part of the laser light amplified in the semiconductor device 1, and an optical reflector for returning a part of the laser light back into the resonator 601. As shown in FIG. 2, the rear optical module 3 has a collimate lens 20, and a grating 21 which is mounted in a Littrow arrangement so as to select light with a predetermined wavelength. The laser light outputted from the rear side of the semiconductor device 1 is collimated by the collimate lens 20, and enters the grating 21 as a collimated light. The grating 21 selectively reflects a laser light with a predetermined wavelength from among the incident collimated lights (wavelength selection). The laser light wavelength-selected by the grating 21 returns to the semiconductor device 1 via the collimate lens 20 again. Thus, shuttling the laser light inside the resonator 601 formed between the output-coupling mirror 2 and the rear optical module 3, particularly the grating 2, while wavelength selection is being performed, a desired single-longitudinal-mode laser light will be resonant-amplified. A part of the resonant-amplified laser light of the desired single-longitudinal-mode is emitted from the output-coupling mirror 2, which also functions as the optical pickup window as mentioned above, to the preamplifier PA as a single-longitudinal-mode pulse laser light. The longitudinal-mode controller 4 controls the resonator length of the resonator 601 by driving the longitudinal-mode actuator 5 so that the wavelength of the single-longitudinal-mode pulse laser light becomes equal to a wavelength of one of the amplifiable lines of the preamplifier PA and the main amplifier MA. That is, the longitudinal-mode controller 4 and the longitudinal-mode actuator 5 function as a controller controlling the semiconductor laser 61 so that the wavelength of the longitudinal-mode laser light emitted from the semiconductor laser 61 which is the master oscillator is included in one of the amplifiable lines S1 to S7 of the preamplifier PA and the main amplifier MA. In addition, the controller can include a signal generator which generates a signal for oscillating the semiconductor device 1 in the semiconductor laser 61 and outputs the signal to the semiconductor device 1, a temperature controller for controlling a temperature of the semiconductor laser 61, in particular the semiconductor device 61, and so on.

The single-longitudinal-mode pulse laser light emitted from the semiconductor device 1 via the output-coupling mirror 2 enters a optical relay system R1. The optical relay system R1 expands a diameter of the single-longitudinal-mode pulse laser light so that the laser light is to pass evenly over the whole amplifiable domain space of the preamplifier PA filled up with a mixed gas which is an amplifying agency. By arranging that the single-longitudinal-mode pulse laser light passes evenly over the whole amplifiable domain space of the preamplifier PA, it is possible to amplify the laser light under effectively using the amplifying agency filled in the preamplifier PA. As a result, improvement of amplification efficiency at the preamplifier PA can be obtained. In addition, the single-longitudinal-mode pulse laser light outputted from the optical relay system R1 is a collimate light.

The amplified single-longitudinal-mode pulse laser light outputted from the preamplifier PA (hereinafter to be referred to as amplified pulse laser light) is reflected at high-reflective (HR) mirrors M1 and M2, and inputted to a optical relay system R2. The optical relay system R2 further expands a diameter of the amplified pulse laser light so that the laser light is to pass evenly over the whole amplifiable domain space of the main amplifier MA filled up with a mixed gas which is an amplifying agency. By this arrangement, as with the case of the preamplifier PA, improvement of amplification efficiency at the main amplifier MA can be obtained. In addition, the amplified pulse laser light outputted from the optical relay system R2 is a collimate light.

After that, the amplified pulse laser light outputted from the main amplifier MA is collimated by a optical relay system R3, highly reflected by an HR mirror M3 and an off-axis paraboloid mirror M4, and transmitted inside an EUV chamber 10 of the EUV generator thought a window 11.

The off-axis paraboloid mirror M4 reflects the amplified pulse laser light so that the laser light passes thought an aperture 12 formed at a center of a EUV collector mirror M5 in the EUV chamber 10, and focuses the amplified pulse laser light on a target 13. In a case that the target 13 is tin (Sn), Sn becomes plasma by being irradiated with the condensed amplified pulse laser light. From the plasma state Sn (plasma luminous point P10), EUV light with a wavelength of 13.5 nm is emitted. The EUV collector mirror M5 transfers an image of the plasma luminous point P10 being an EUV light source on an intermediate focus point P20. That is, the EUV collector mirror M5 collects the EUV light emitted from the plasma luminous point P10 on the intermediate focus point P20. The collected EUV light is expanded from the intermediate focus point P20 and transmitted inside the exposure apparatus (not shown).

Here, the amplifiable lines of the preamplifier PA and the main amplifier MA will be described. In the first embodiment, amplifiers which use mixed gases including $CO_2$ gas as an amplifying agency are used for the preamplifier PA and the main amplifier MA. As shown in FIG. 3, wavelength bands (amplifiable lines), in which the amplifiers using the mixed gases including $CO_2$ gas as an amplifying agency oscillates or which is amplified at this amplifiers, include a plurality of rotation bands, one of which being near 10.6 μm (transition band 00°1 to 10°0) and another one being near 9.6 μm (transition band 00°1 to 02°0). In addition, data shown in FIG. 3 was obtained under conditions that a mixing rate of the amplifying agencies was set to $CO_2:N_2:He=1:1:8$, a pressure was set to 100 [torr], and a temperature was set to 450 [K].

Figure 4:
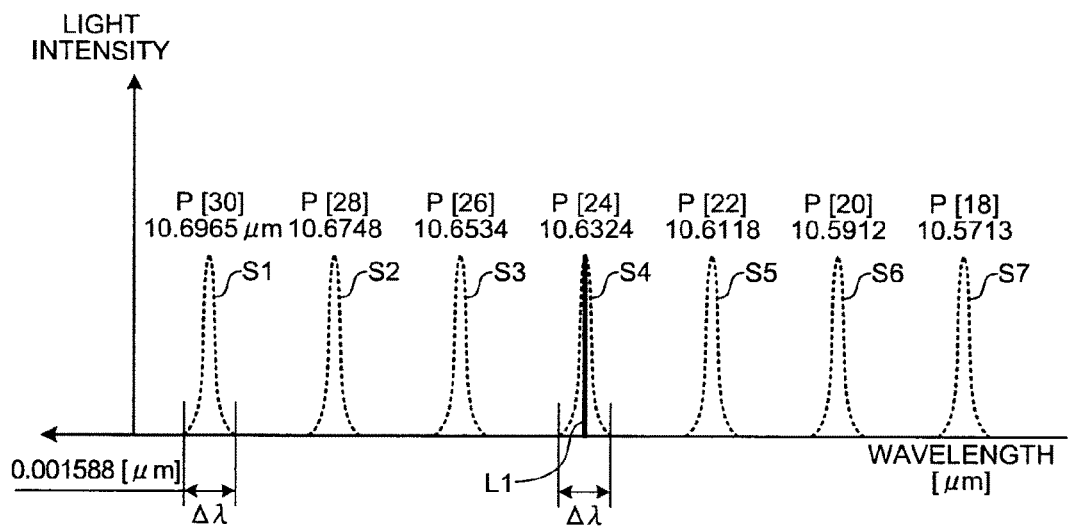
FIG. 4 is an image showing a graph of a relationship between amplifiable lines of a preamplifier and a main amplifier and an oscillating longitudinal-mode of the semiconductor laser according to the first embodiment of the present invention.

Among the rotation bands shown in FIG. 3, optical intensity spectra of the amplifiable lines of bands P(30), P(28), P(26), P(24), P(22), P(20) and P(18) which are included in the rotation band near 10.6 μm are shown as broken lines in FIG. 4. As mentioned above, the longitudinal-mode controller 4 controls a distance (resonator length) between the output-coupling mirror 2 and the rear optical module 3 by driving the longitudinal-mode actuator 5. Accordingly, a resonance point of the resonator 601 as formed between the output-coupling mirror 2 and the rear optical module 3 can be controlled. In this arrangement, the resonance point of the resonator 601 is controlled by using the longitudinal-mode controller 4 so that the semiconductor device 1 emits a single-longitudinal-mode laser light L1 which falls in an amplifiable line width $\Delta\lambda(=0.001588$ μm) of the band P(24) (of which oscillating wavelength is 10.6324 μm) shown as the amplifiable line S4. Thus, by using a wavelength-tunable laser of which wavelength can be controlled as the master oscillator, it is easily possible to make the wavelength of the amplified pulse laser light outputted from the master oscillator correspond with one of the amplifiable lines of an amplifier, i.e. the preamplifier PA and the main amplifier MA. In this case, an oscillating wavelength of the wavelength-tunable laser is controlled by executing a wavelength selecting control including a rotation control of the grating 21 and a control of resonator 601. Especially, by arranging such that the wavelength of the longitudinal-mode laser light L1 is adjusted around a center wavelength (=10.6324±0.000794 μm) of the amplifiable line S4, it becomes possible to make the preamplifier PA and the main amplifier MA effectively output the amplified pulse laser light with high power.

In the first embodiment, because the master oscillator is the semiconductor laser 61 (especially the semiconductor device 1), wavelength control of thereof is easy. Additionally, because the semiconductor laser 61 (especially the semiconductor device 1) is a solid-state device, handling thereof is also easy. Furthermore, by using the semiconductor device 1 being a semiconductor laser as the master oscillator, a highly-repetitive pulse with several 100 KHz can be easily generated with simpler current control, as compared with a case of using another gas laser or solid-state laser as a master oscillator.

In addition, as for the wavelength control of the master oscillator, it is not limited to the wavelength selection technique using a grating as described above. A wavelength selection technique using an etalon or an oblique-incidence arranged grating can be also applied to the control.

Moreover, in this embodiment and each of the embodiments (including alternative examples) which will be described later on, it is preferable that a pulse shape of the longitudinal-mode laser light outputted from the semiconductor device 1 can be controlled. By this arrangement, it becomes possible to adjust a time waveform of the pulse laser light which is to be emitted to the target 13 such that generation of debris around the plasma luminous point P10 can be controlled effectively. As a result, it becomes possible to optimize conversion efficiency (CE) from the target 13 to plasma. In addition, the pulse shape of the longitudinal-mode laser light outputted from the semiconductor device 1 can be easily controlled by controlling a shape of a signal inputted to the semiconductor device 1, that is, by switching the shape of the signal generated by a signal generator. Because the signal shape in the signal generator can be switched by using a comparatively simple technique as an analog process or a digital process, it is possible to easily generate a signal with a pulse shape suited to inhibit generation of debris.

Second Embodiment

Next, a second embodiment of the present invention will be described in detail. In the above-mentioned first embodiment, the single-longitudinal-mode pulse laser light L1 is used as a laser light for being amplified by the resonator 601 including the semiconductor device 1, and the wavelength of this single-longitudinal-mode pulse laser light L1 is adjusted to one of the amplifiable lines S1 to S7 of the preamplifier PA and the main amplifier MA. On the other hand, in the second embodiment, multiple-longitudinal-mode pulse laser lights are used as laser lights for being amplified by a resonator including a semiconductor device, and wavelengths of the multiple-longitudinal-mode pulse laser lights are adjusted to amplifiable lines of the preamplifier PA and the main amplifier MA, respectively. In the following, the same reference numbers will be used for the structural elements that are the same as the first embodiment, and redundant explanations of those structural elements will be omitted.

Figure 5:
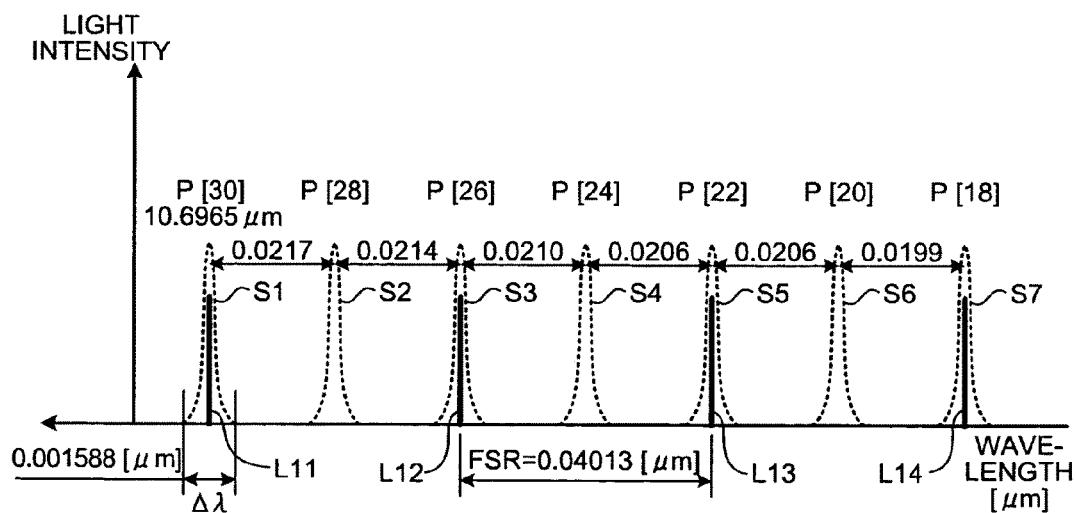
FIG. 5 is an image showing a graph of a relationship between the amplifiable lines of the preamplifier and the main amplifier and an oscillating longitudinal-mode of a semiconductor laser according to a second embodiment of the present invention.

Here, when a light path length 'nd', in a case where the resonator length including the semiconductor device 1 is 'd' and the refractive index inside the resonator 601 is 'n', is nd=0.0014 m=1.4 mm, the longitudinal-mode intervals FSR (free spectral range) are FSR=0.04013 μm. On the other hand, as shown in FIG. 5, a wavelength interval between each of the amplifiable lines S1 to S7 of the preamplifier PA and the main amplifier MA is about 0.02 μm. That is, the longitudinal-mode interval FSR between each of the multiple-longitudinal-mode pulse laser lights L11 to L14 corresponds to twice the wavelength interval between each of the amplifiable lines S1 to S7 of the preamplifier PA and the main amplifier MA. Accordingly, it is possible to adjust the wavelengths of the multiple-longitudinal-mode pulse laser lights L11 to L14 to alternately adjacent amplifiable lines S1, S3, S5 and S7, each of which has the amplifiable line width $\Delta\lambda(=0.001588$ μm), among the amplifiable lines S1 to S7 of the preamplifier PA and the main amplifier MA. FIG. 5 shows the case that the wavelengths of the multiple-longitudinal-mode pulse laser lights L11 to L14 are adjusted to the amplifiable lines S1, S3, S5 and S7 corresponding to the modes P(30), P(26), P(22) and P(18), respectively.

Figure 6:
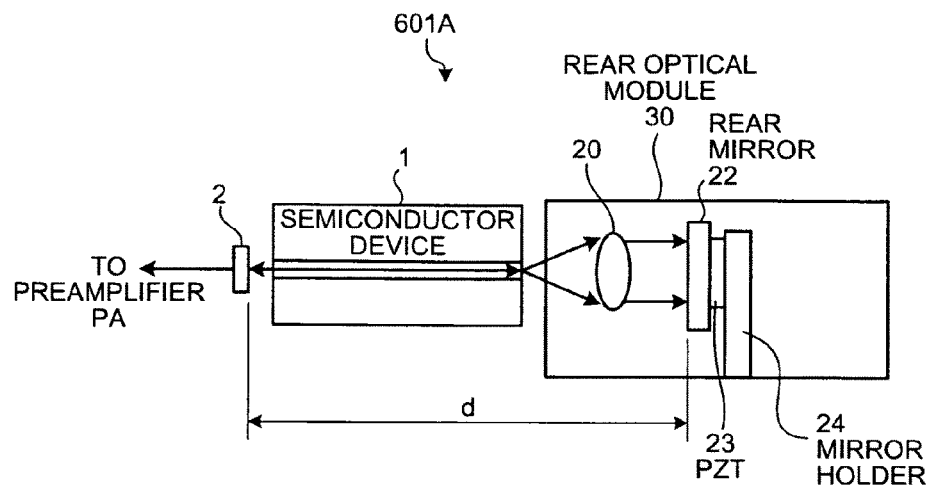
FIG. 6 is a schematic diagram showing an example of the semiconductor laser according to the second embodiment of the present invention.

A wavelength adjustment of the semiconductor laser 61 is controlled by the longitudinal-mode controller 4. Here, for oscillating the semiconductor laser 61 in the multiple-longitudinal-mode, a Fabry-Perot resonator is used as the semiconductor laser 61. In this second embodiment, as shown in FIG. 6, the resonator 601 of the semiconductor laser 61 in the first embodiment is replaced with a Fabry-Perot type resonator 601A. The resonator 601A has a rear optical module 30 in place of the rear optical module 3. The rear optical module 30 includes a highly-reflective rear mirror 22. The Fabry-Perot type resonator 601A is formed between the rear mirror 22 and the output-coupled mirror 2 located at the front side of the semiconductor device 1. Furthermore, the rear optical module 30 is located inside the resonator 601A, and it has a collimate lens 20 which collimates laser lights outputted from the semiconductor device 1 while being beam-expanded and transmits the collimated laser lights into the rear mirror 22. Moreover, for adjusting the resonator length 'd' of the resonator 601A, the rear optical module 30 has a PZT 23 which shifts the rear mirror 22 along with an optical axis of the longitudinal-mode laser lights. This PZT 23 is constructed from a piezo element, and controlled by the longitudinal-mode controller 4. Moreover, the rear optical module 30 has a mirror holder 24 for holding the PZT 23 of which the rear mirror 23 is attached.

As mentioned above, the rear optical module 30 controls the multiple-longitudinal-mode by changing the resonator length 'd' of the resonator 601A. However, this is not an indispensable requirement, while it is acceptable as long as the resonator length (light path length) of the resonator 601A can be adjusted. For instance, it is acceptable to have a structure which changes the refraction index 'n' of the semiconductor device 1 and changes the substantial resonator length by controlling a temperature of the semiconductor device 1 using a temperature controller located near the semiconductor device 1.

In the second embodiment, the multiple-longitudinal-mode pulse laser lights can be simultaneously amplified in the plurality of amplifiable lines S1 to S7 of the preamplifier PA and the main amplifier MA. As a result, it is possible to improve amplification efficiency of laser lights in the driver laser.

Third Embodiment

Figure 7:
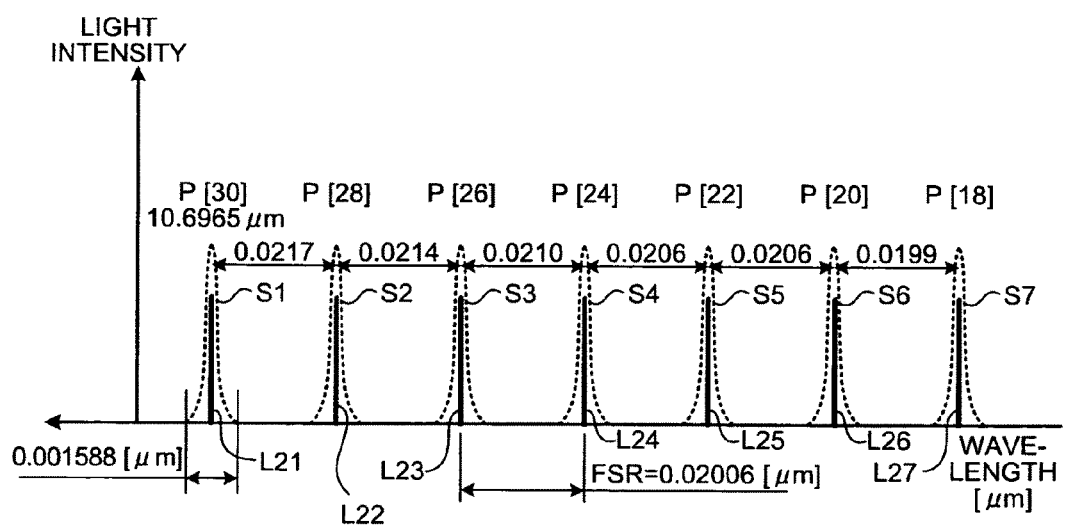
FIG. 7 is an image showing a graph of a relationship between the amplifiable lines of the preamplifier and the main amplifier and an oscillating longitudinal-mode of a semiconductor laser according to a third embodiment of the present invention.

Next, a third embodiment of the present invention will be described in detail. In the third embodiment, as shown in FIG. 7, by adjusting the wavelengths of the multiple-longitudinal-mode pulse laser lights L21 to L27 to all of the amplifiable lines S1 to S7 of the preamplifier PA and the main amplifier MA, the multiple-longitudinal-mode pulse laser lights L21 to L27 are amplified, respectively. In the following, the same reference numbers will be used for the structural elements that are the same as the first embodiment, and redundant explanations of those structural elements will be omitted.

In this case, as with the case of the second embodiment, a light path length 'nd' of the resonator 601A is adjusted so that the longitudinal-mode intervals FSR are made to substantively correspond with the wavelength intervals among the amplifiable lines S1 to S7. For example, when the light path length 'nd' is nd=0.0028 nm=2.8 mm, each of the longitudinal-mode interval FSR is FSR=0.02006 μm. By this arrangement, because each of the wavelength intervals among the amplifiable lines S1 to S7 substantively corresponds to the longitudinal-mode interval FSR of the semiconductor laser 61, it is possible to adjust the wavelengths of the multiple-longitudinal-mode pulse laser lights L21 to L27 to the amplifiable lines S1 to S7 each of which has the amplifiable line width Δλ, respectively.

In this third embodiment, by having the structure that the wavelengths of the multiple-longitudinal-mode pulse laser lights of the semiconductor laser 61 correspond to all of the amplifiable lines of the preamplifier PA and the main amplifier MA, it is possible to improve amplification efficiency of laser lights in the driver laser.

Fourth Embodiment

Figure 8:
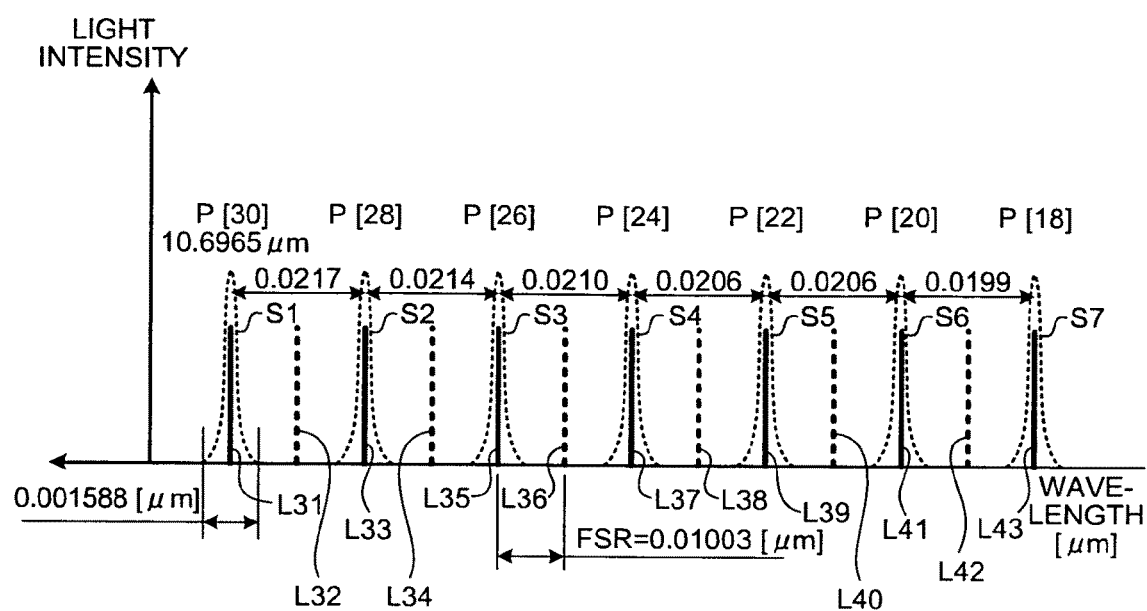
FIG. 8 is an image showing a graph of a relationship between the amplifiable lines of the preamplifier and the main amplifier and an oscillating longitudinal-mode of a semiconductor laser according to a fourth embodiment of the present invention.

Next, a fourth embodiment of the present invention will be described in detail. In this fourth embodiment, as shown in FIG. 8, by adjusting wavelengths of alternately adjacent multiple-longitudinal-mode pulse laser lights L31, L33, L35, L37, L39, L41 and L43 to all of the amplifiable lines S1 to S7, respectively, the multiple-longitudinal-mode pulse laser lights L31, L33, L35, L37, L39, L41 and L43 are amplified, respectively. In the following, the same reference numbers will be used for the structural elements that are the same as the first embodiment, and redundant explanations of those structural elements will be omitted.

In this case, as with the case of the second embodiment, the light path length 'nd' of the resonator 601A is adjusted so that the longitudinal-mode interval FSR is made to substantively correspond with half the wavelength interval between each of the amplifiable lines S1 to S7. For example, when the light path length 'nd' is nd=0.056 m=56 mm, the longitudinal-mode interval FSR is FSR=0.01003 μm. By this arrangement, the half of each of the wavelength intervals among the amplifiable lines S1 to S7 and the longitudinal-mode interval FSR of the semiconductor laser 61 is made to correspond with each other. Thereby, it is possible to adjust the wavelengths of the alternatively adjacent multiple-longitudinal-mode pulse laser lights L31, L33, L35, L37, L39, L41 and L43 to the amplifiable lines S1 to S7 each of which has the amplifiable line width Δλ, respectively.

In this fourth embodiment, because the wavelengths of the parts of the multiple-longitudinal-mode pulse laser lights of the semiconductor laser 61 are made to correspond with all of the amplifiable lines of the preamplifier PA and the main amplifier MA, it is possible to improve amplification efficiency of laser lights in the driver laser.

In addition, in the above-mentioned second to fourth embodiments, the longitudinal-mode intervals FSR of a plurality of longitudinal-mode pulse laser lights are adjusted so that the wavelengths of the longitudinal-mode pulse laser lights are adjusted to the amplifiable lines of which wavelength intervals are substantively even. However, it is not limited to such structure. This wavelength adjusting structure can be arranged arbitrarily. For instance, the longitudinal-mode intervals can be further shortened so that a plurality of longitudinal-mode pulse laser lights (e.g. three or more longitudinal-mode pulse laser lights) can exist between the adjacent amplifiable lines. Moreover, the wavelength adjusting structure as mentioned above can be applied to other amplifiable lines of the preamplifier PA and the main amplifier MA, such as bands P(32) to P(38), for instance.

In the above-mentioned first to fourth embodiments, the semiconductor laser is used as the master oscillator. However, the master oscillator can also be a laser apparatus which is different from an amplifier having a molecular gas used for the preamplifier PA and the main amplifier MA as an amplifying agency (specifically an amplifier having $CO_2$ gas or a mixed gas including $CO_2$ gas as an amplifying agency).

Fifth Embodiment

Next, a fifth embodiment of the present invention will be described in detail. In this fifth embodiment, wavelengths of longitudinal-mode pulse laser lights outputted from a semiconductor laser are directly detected, and the semiconductor laser is feedback-controlled so that the wavelengths of the longitudinal-mode pulse laser lights are made to correspond with the amplifiable lines. In the following, the same reference numbers will be used for the structural elements that are the same as the first embodiment, and redundant explanations of those structural elements will be omitted.

Figure 9:
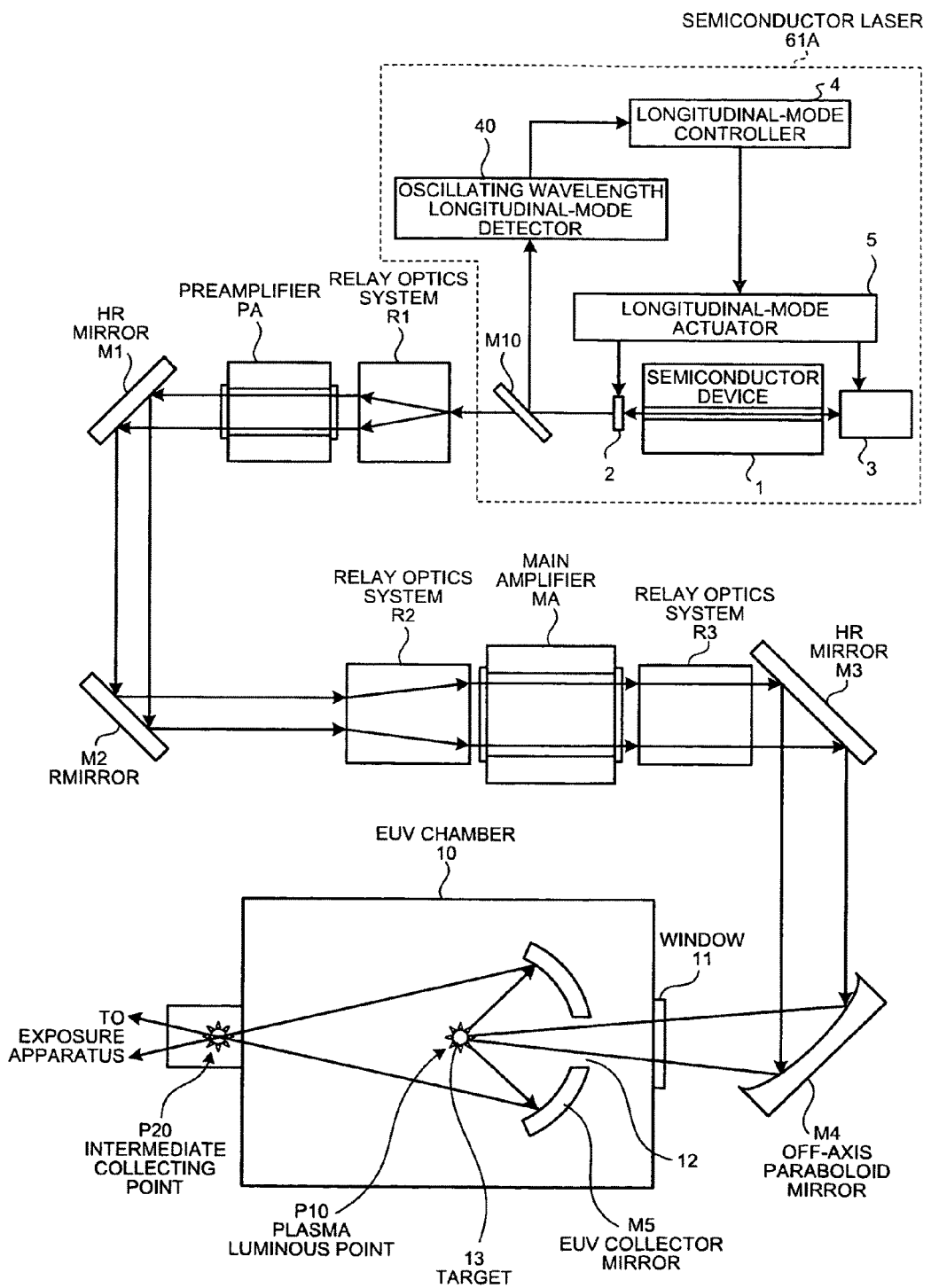
FIG. 9 is a block diagram showing a structure of an extreme ultraviolet light source apparatus according to a fifth embodiment of the present invention.

FIG. 9 is a block diagram showing a structure of an extreme ultraviolet light source apparatus according to the fifth embodiment of the present invention. In the fifth embodiment, the semiconductor laser 61 in the extreme ultraviolet light source apparatus (shown in FIG. 1) is replaced with a semiconductor laser 61A. The semiconductor laser 61A has the same structure as the semiconductor laser 61, but further includes a beam splitter M10 which is located between the output-coupling mirror 2 and the optical relay system R1, and an oscillating wavelength longitudinal-mode detector 40 which detects wavelengths (hereinafter to be also referred to as oscillating longitudinal-mode wavelength) of longitudinal-mode pulse laser lights among parts of lights reflected by the beam splitter M10. The rest of the structure is the same as the extreme ultraviolet light source apparatus shown in FIG. 1, and the same reference numbers are used for referring to the same structural elements. In addition, for the rear optical module 3, the rear optical module 30 shown in the second to fourth embodiments can be used. Moreover, the semiconductor laser 61A outputs single/multiple longitudinal-mode pulse laser light.

Figure 10:
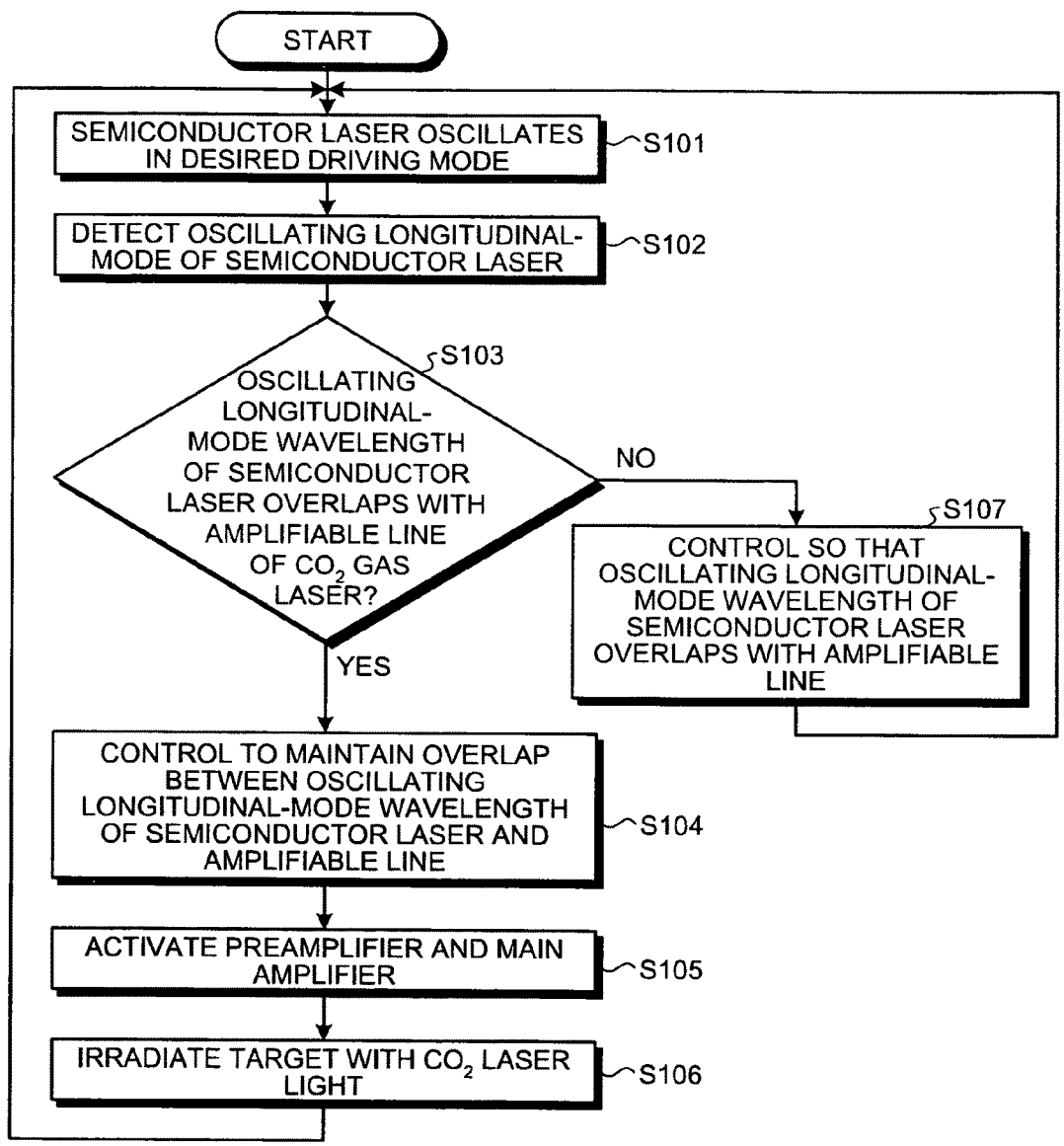
FIG. 10 is a flowchart showing a wavelength controlling process by a longitudinal-mode controller shown in FIG. 9.

Here, a wavelength controlling process according to the fifth embodiment will be described in detail with reference to a flowchart shown in FIG. 10. As shown in FIG. 10, firstly, the extreme ultraviolet light source apparatus makes the semiconductor laser 61A oscillate in several 100 kHz, for instance (step S101). At this time, the extreme ultraviolet light source apparatus drives the longitudinal-mode actuator 5 via the longitudinal-mode controller 4 in accordance with a preset predetermined driving mode and controls a position of the output-coupling mirror 2 and the rear optical module 3 so that the semiconductor laser 61A outputs a repetitive pulse with a desired cycle (several 100 kHz). In addition, in this case, it is acceptable to pre-set a rough resonator length 'nd'. Next, the extreme ultraviolet light source apparatus makes the oscillating wavelength longitudinal-mode detector 40 detect a current oscillating longitudinal-mode wavelength (step S102). Next, the extreme ultraviolet light source apparatus makes the longitudinal-mode controller 4 judge whether the oscillating longitudinal-mode wavelengths of the semiconductor laser 61A overlap the amplifiable lines S1 to S7 of the preamplifier PA and the main amplifier MA, based on the longitudinal-mode wavelengths detected by the oscillating wavelength longitudinal-mode detector 40 (step S103).

When the oscillating longitudinal-mode wavelengths of the semiconductor laser 61A do not overlap the amplifiable lines S1 to S7 of the preamplifier PA and the main amplifier MA (step S103; No), the extreme ultraviolet light source apparatus finely adjusts the position of either or both of the grating 21 and the PZT 23 by driving the longitudinal-mode actuator 5 so that the oscillating longitudinal-mode wavelengths overlap inside the amplifiable lines S1 to S7 (step S107), after which the extreme ultraviolet light source returns to step S101. By this arrangement, the semiconductor laser 61A is feedback-controlled so that the wavelengths of the longitudinal-mode pulse laser lights (oscillating longitudinal-mode wavelength) correspond to the wavelengths of the amplifiable lines S1 to S7 of the preamplifier PA and the main amplifier MA.

On the other hand, when the oscillating longitudinal-mode wavelengths of the semiconductor laser 61A overlap the amplifiable lines S1 to S7 of the preamplifier PA and the main amplifier MA (step S103; Yes), the extreme ultraviolet light source apparatus executes a control for maintaining the current state in that the oscillating longitudinal-mode wavelengths overlap the amplifiable lines S1 to S7 (step S104). Next, the extreme ultraviolet light source apparatus makes the preamplifier PA and the main amplifier MA actuate to be set to an amplifiable state (step S105), and then, irradiates the target 13 with the longitudinal-mode pulse laser lights amplified by the preamplifier PA and the main amplifier MA for making the target 13 emit the EUV lights with the wavelength of 13.5 nm (step S106). After that, the extreme ultraviolet light source apparatus returns to step S101 and repeats the above-mentioned processes. By executing the above-mentioned operation, in the sixth embodiment, it is possible to maintain the state in that the oscillating longitudinal-mode wavelengths of the semiconductor laser 61A overlap inside the amplifiable lines S1 to S7 of the preamplifier PA and the main amplifier MA, respectively. Thereby, it is possible to stably-irradiate the target 13 with the laser lights amplified with high efficiency.

Sixth Embodiment

Next, a sixth embodiment of the present invention will be described in detail. In this fifth embodiment, an amplification state of the preamplifier PA is detected, and a semiconductor laser is feedback-controlled based on the detected amplification state so that wavelength of longitudinal-mode laser lights outputted from the semiconductor laser correspond to wavelengths of the amplifiable lines of the preamplifier PA and the main amplifier MA. In the following, the same reference numbers will be used for the structural elements that are the same as the first embodiment, and redundant explanations of those structural elements will be omitted.

Figure 11:
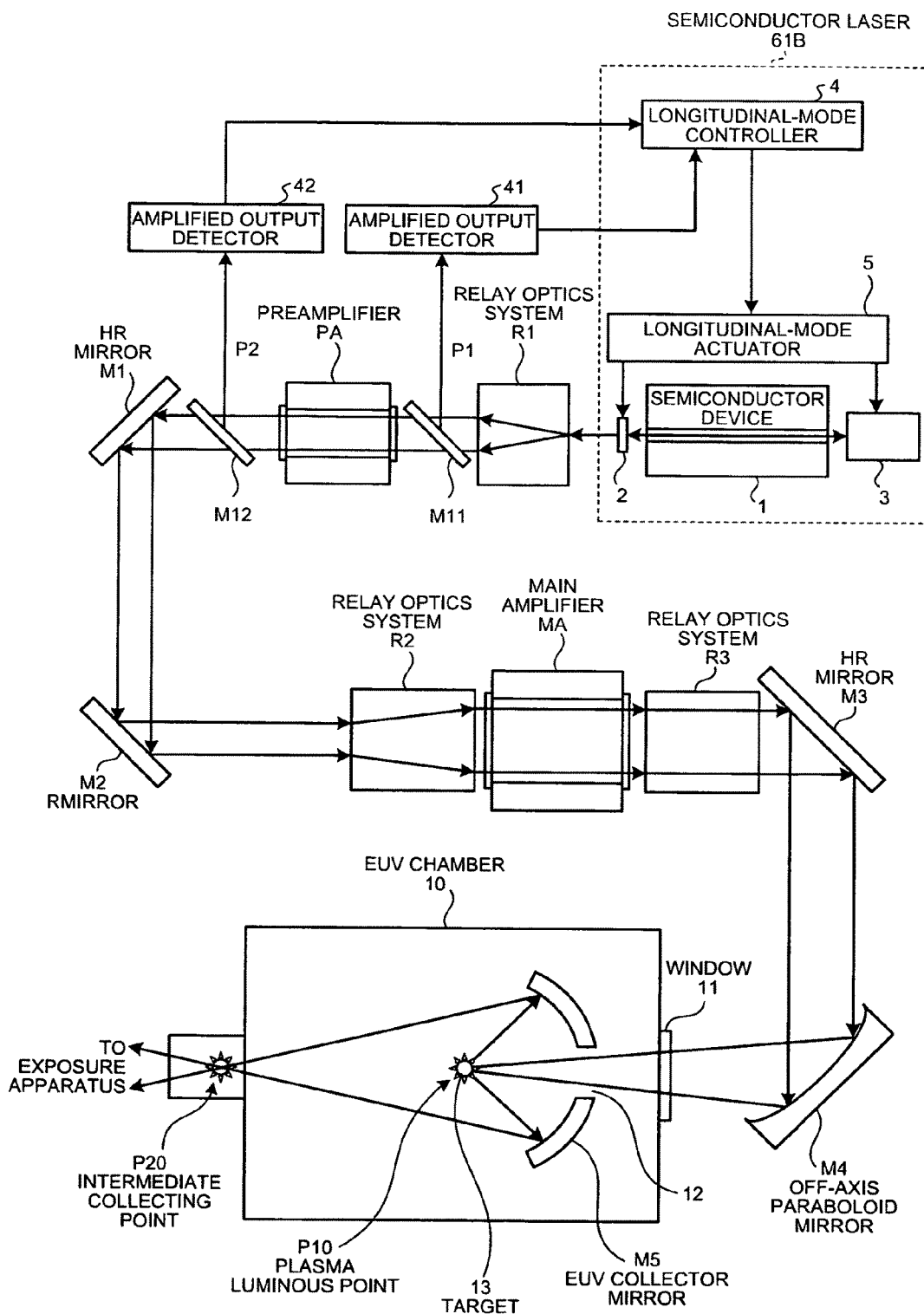
FIG. 11 is a block diagram showing a structure of an extreme ultraviolet light source apparatus according to a sixth embodiment of the present invention.

FIG. 11 is a block diagram showing a structure of an extreme ultraviolet light source apparatus according to the sixth embodiment of the present invention. In the sixth embodiment, the semiconductor laser 61/61A in the extreme ultraviolet light source apparatus (shown in FIG. 1/9) is replaced with a semiconductor laser 61B. Moreover, the extreme ultraviolet light source apparatus has beam splitters M11 and M12 which are located at an input stage and an output stage of the preamplifier PA, respectively, an amplified output detector 41 which detects output of laser lights being inputted into the preamplifier PA from among parts of lights reflected by the beam splitter M11, and an amplified output detector 42 which detects output of laser lights outputted from the preamplifier PA from among parts of lights reflected by the beam splitter M12. The rest of the structure is the same as the extreme ultraviolet light source apparatus shown in FIG. 1, and the same reference numbers are used for referring to the same structural elements. In addition, for the rear optical module 3, the rear optical module 30 shown in the second to fifth embodiments can be used. Moreover, the semiconductor laser 61B outputs single/multiple longitudinal-mode pulse laser light.

Figure 12:
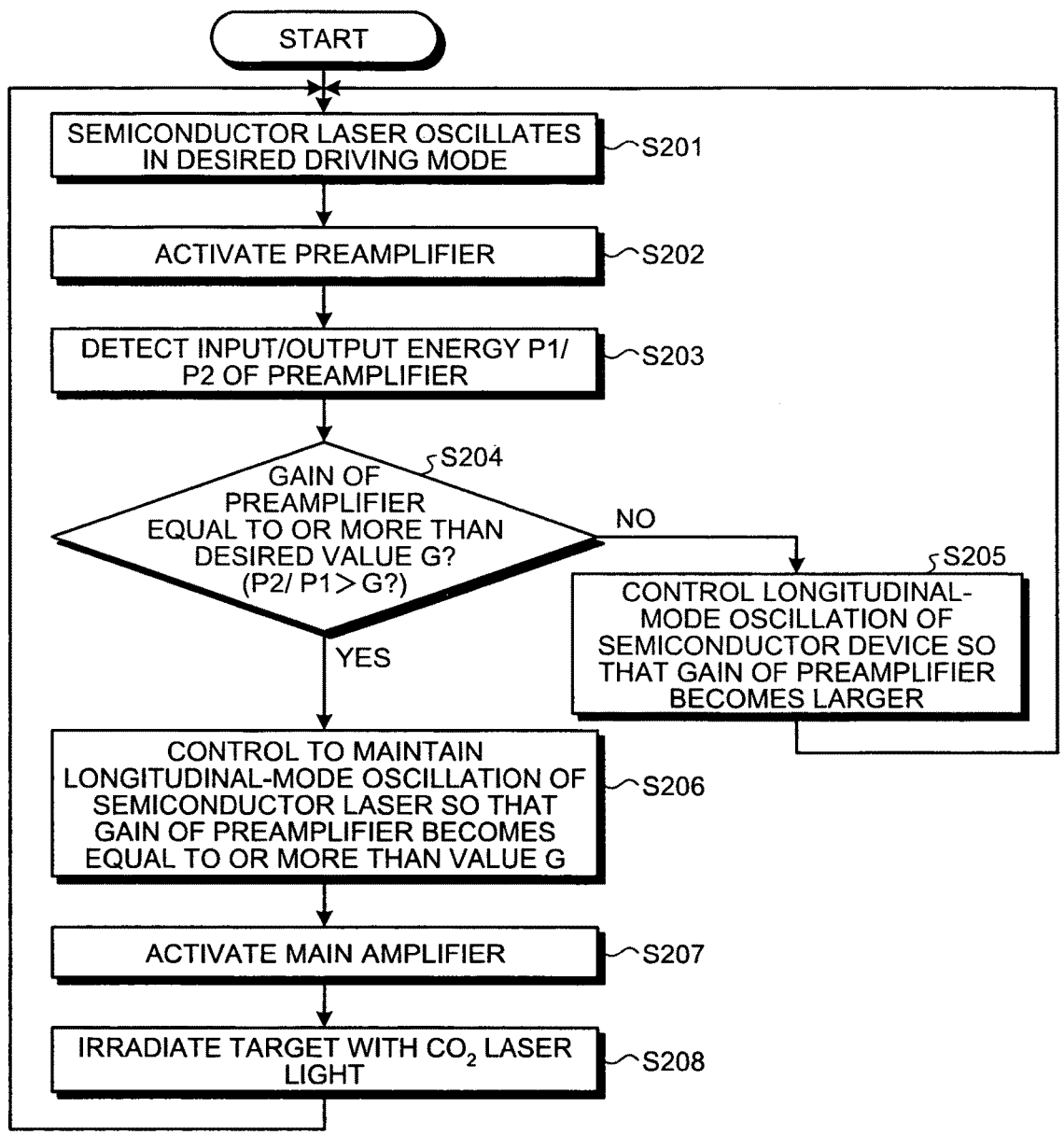
FIG. 12 is a flowchart showing a wavelength controlling process by a longitudinal-mode controller shown in FIG. 11.

Here, a wavelength controlling process according to the sixth embodiment will be described in detail with reference to a flowchart shown in FIG. 12. As shown in FIG. 12, firstly, the extreme ultraviolet light source apparatus makes the semiconductor laser 61B oscillate in several 100 kHz, for instance (step S201). At this time, the extreme ultraviolet light source apparatus drives the longitudinal-mode actuator 5 via the longitudinal-mode controller 4 in accordance with a preset predetermined driving mode and controls a position of the output-coupling mirror 2 and the rear optical module 3 so that the semiconductor laser 61B outputs a repetitive pulse with a desired cycle (several 100 kHz). In addition, in this case, it is acceptable to have a brief resonator length 'nd' pre-set. Next, the extreme ultraviolet light source apparatus makes the preamplifier PA actuate to be in an amplifiable state (step S202), and then, makes the amplified output detectors 41 and 42 detect an input energy P1 and an output energy P2 of the preamplifier PA, respectively (step S203). After that, the extreme ultraviolet light source apparatus makes the longitudinal-mode controller 4 judge whether a gain (P2/P1) of the preamplifier PA is equal to or more than a desired value 'G' (step S204).

Here, the case in that the gain (P2/P1) of the preamplifier PA is less than the desired value 'G' means that an overlap status between the oscillating longitudinal-mode wavelengths of the semiconductor laser 61B and the amplifiable lines S1 to S7 of the preamplifier PA and the main amplifier MA is poor. Accordingly, when the gain (P2/P1) of the preamplifier PA is less than the desired value 'G' (step S204; No), the extreme ultraviolet light source apparatus finely adjusts the position of either or both of the grating 21 and the PZT 23 by driving the longitudinal-mode actuator 5 so that the oscillating longitudinal-mode wavelengths of the semiconductor laser 61B overlap with the amplifiable lines S1 to S7 of the preamplifier PA and the main amplifier MA, or more specifically so that, the gain of the preamplifier PA becomes equal to or more than the desired value 'G' which is optimally a maximum value (step S205), after which, the process of the extreme ultraviolet light source apparatus returns to step S201. By this arrangement, the semiconductor laser 61B is feedback-controlled so that the wavelengths of the longitudinal-mode pulse laser lights (oscillating longitudinal-mode wavelength) correspond to the amplifiable lines S1 to S7 of the preamplifier PA and the main amplifier MA.

On the other hand, when the gain (P2/P1) of the preamplifier PA is equal to or more than the desired value 'G' (step S204; Yes), the extreme ultraviolet light source apparatus executes control for maintaining the current state in that the oscillating longitudinal-mode wavelengths overlap with the amplifiable lines S1 to S7 (step S206), because the overlap status between the oscillating longitudinal-mode wavelengths of the semiconductor laser 61B and the amplifiable lines S1 to S7 of the preamplifier PA and the main amplifier MA is better. Next, the extreme ultraviolet light source apparatus makes the main amplifier MA actuate to be in an amplifiable state (step S207), and then, irradiates the target 13 with the amplified longitudinal-mode pulse laser lights for making the target 13 emit the EUV lights with the wavelength of 13.5 nm (step S208). After that, the extreme ultraviolet light source apparatus returns to step S201 and repeats the above-mentioned processes. By executing the above-mentioned operation, in the sixth embodiment, it is possible to maintain the state in that the oscillating longitudinal-mode wavelengths of the semiconductor laser 61B overlap with the amplifiable lines S1 to S7 of the preamplifier PA and the main amplifier MA. Thereby, it is possible to stably-irradiate the target 13 with the laser lights amplified with high efficiency.

Seventh Embodiment

Figure 13:
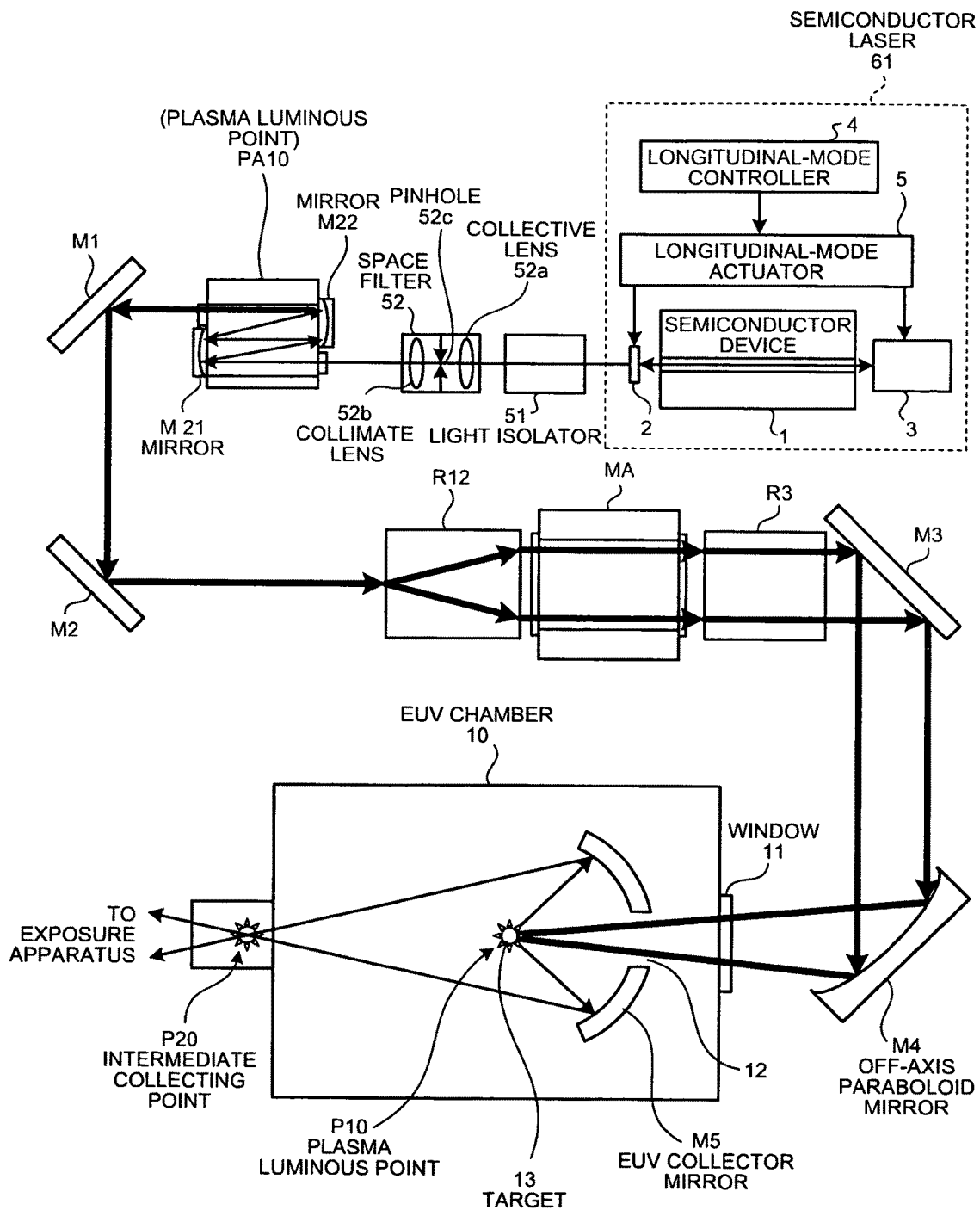
FIG. 13 is a block diagram showing a structure of an extreme ultraviolet light source apparatus according to a seventh embodiment of the present invention.

Next, a seventh embodiment of the present invention will be described in detail. In an extreme ultraviolet light source apparatus according to this seventh embodiment, as shown in FIG. 13, a slab laser PA10 is used as a preamplifier. Moreover, the extreme ultraviolet light source apparatus has an optical isolator 51 for preventing return light from entering the semiconductor laser 61 from the slab laser PA10, and a spatial filter 52 for shutting out high-order lateral-mode lights. In the following, the same reference numbers will be used for the structural elements that are the same as the first embodiment, and redundant explanations of those structural elements will be omitted. In FIG. 13, the longitudinal-mode pulse laser lights, of which wavelength is controlled by the longitudinal-mode controller 4, from the semiconductor laser 61 are inputted into the slab laser PA10 as being a preamplifier through the optical isolator 51 and the spatial filter 52, sequentially, and are amplified by the slab laser PA10. As the optical isolator 51, a Faraday rotator or a gas cell with a saturable absorber using $SF_2$ gas, for instance, can be used. The spatial filter 52 includes a collector lens 52a, a pinhole 52c and a collimate lens 52b. The collector lens 52a collects the longitudinal-mode pulse laser lights having entered via the optical isolator 51. The pinhole 52c shuts the high-order lateral-mode in the longitudinal-mode pulse laser lights having been collected by the collector lens 52a, and transmits only single or low-order lateral-mode laser lights. The collimate lens 52b collimates the laser light passing through the pinhole 52c. The laser light outputted from the spatial filter 52 enters an input window of the slab laser PA10. The slab laser PA10 has a structure in that a tabular amplifiable region is sandwiched between mirrors M21 and M22. Accordingly, the laser lights having entered the slab laser PA 10 are multipass-amplified by shuttling between the mirrors M21 and M22 and passing through the amplifiable region of the slab laser PA10 more than once. Moreover, the multipass-amplified laser lights are outputted to the HR mirror M1 via an output window (hereinafter to be also referred to as optical pickup window) of the slab laser PA10.

The amplified laser lights reflected at the HR mirrors M1 and M2 are expand by the optical relay system R12 so that the laser lights pass through evenly over the whole amplifiable domain space of the main amplifier MA. The laser lights additionally amplified by the main amplifier MA are collimated by the optical relay system R3. After that, the collimated laser lights are emitted to the target 13 via the HR mirror M3 and the off-axis paraboloid mirror M4.

The driver laser according to the seventh embodiment can output laser lights of which high-order lateral-mode is shut by the spatial filter 52. Moreover, a part of the return light that can occur by self-oscillation of the slab laser PA10 and by reflection of a part of the laser light from the preamplifier PA and the main amplifier MA on the target 13 can be shut using the spatial filter 52. Furthermore, by using the optical isolator 51, it is possible to prevent the return light passing through the spatial filter 52 from entering the semiconductor laser 61. As a result, it is possible to not only output the pulse laser lights with good light-harvesting, but also obtain a stable pulse-amplification.

Eighth Embodiment

Next, an eighth embodiment of the present invention will be described in detail. The above-mentioned semiconductor laser 61/61A/61B outputs a plurality of oscillating longitudinal-mode laser lights of which wavelength intervals substantially correspond to the wavelength intervals of the amplifiable lines S1 to S7. Consequently, in a case where Sn is used as the target 13, a substantial resonator length (optical path length) 'nd' considering a refractive index 'n' should be designed to be a quite short length such as 1.4 mm, 2.8 mm, or the like. For this reason, the semiconductor laser 61/61A/61B is designed to be very small. In addition, 'd' is a resonator length decided based on a length between the output-coupling mirror 2 and the rear optical module 3 (especially, the rear mirror 22 or the grating 21 in the rear optical module 3), and 'n' is a refractive index inside the resonator. Consequently, in this eighth embodiment, the resonator length 'd' is designed to be a large value. By this arrangement, a size of the semiconductor laser can be designed to be an easily manufacturable size. In the following specific example, the resonator length 'd' is designed to be fifty times the minimum required resonator length. In this arrangement, the substantial resonator length (optical path length) 'nd' with consideration of the refractive index 'n' is 70 mm. In the following, the same reference numbers will be used for the structural elements that are the same as the first embodiment, and redundant explanations of those structural elements will be omitted.

Figure 14:
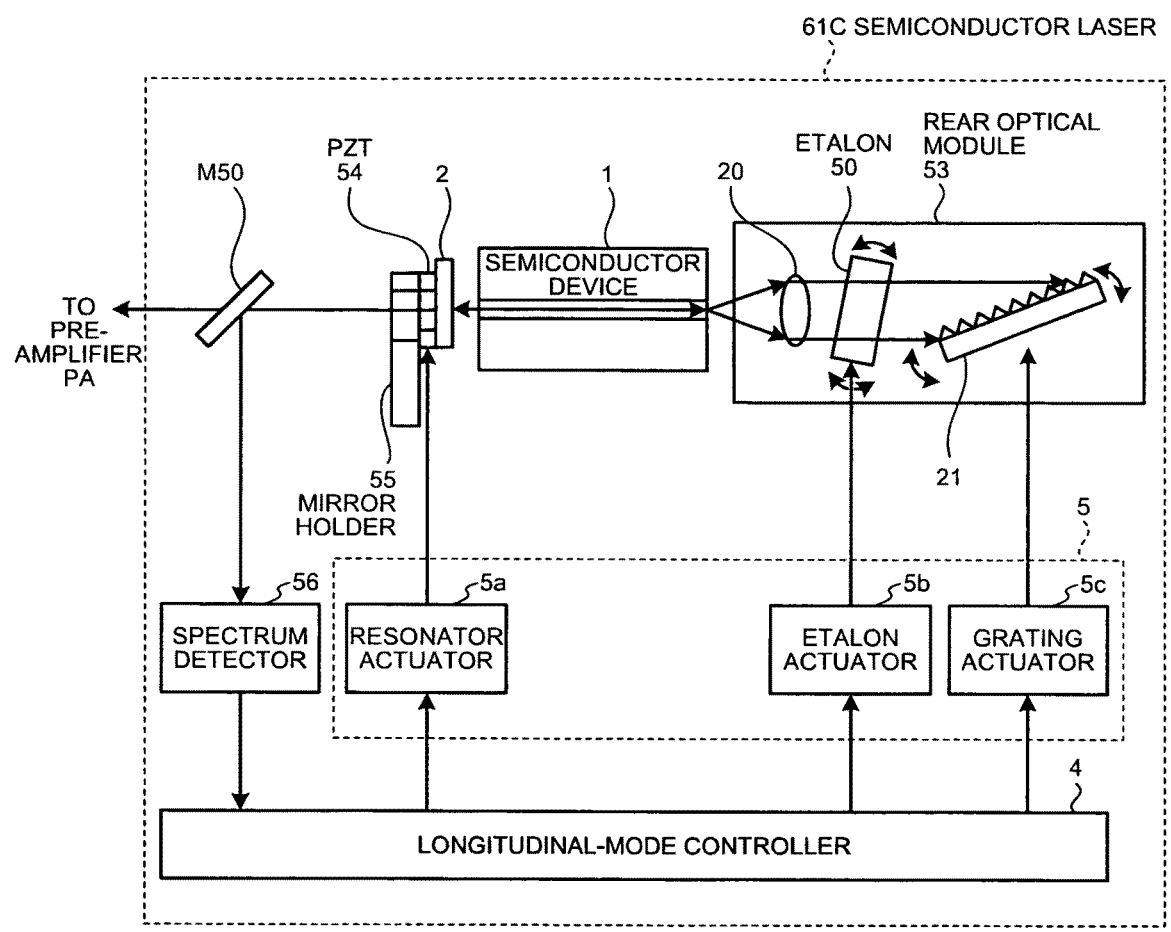
FIG. 14 is a block diagram showing a structure of a semiconductor laser used for an extreme ultraviolet light source apparatus according to an eighth embodiment of the present invention.

FIG. 14 is a block diagram showing a structure of a semiconductor laser used for an extreme ultraviolet light source apparatus according to the eighth embodiment of the present invention. The semiconductor laser 61C includes a rear optical module 53 that replaces the rear optical module 3 shown in FIG. 2, and further has a PZT 54 and a mirror holder 55, which correspond to the PZT 23 and the mirror holder 24 shown in FIG. 6, at the front side of the output-coupling mirror 2. The rear optical module 53 has the same structure as the rear optical module 3, but further has an etalon 50 located between the grating 21 and collimate lens 20. The resonator is formed between the output-coupling mirror 2 and the grating 21. The laser lights outputted from the resonator enter the beam splitter M50. The beam splitter M50 reflects parts of the inputted laser lights, and transmits residual laser lights and output the lights to the preamplifier PA.

That is, the lights generated in the semiconductor device 1 change into collimate lights by entering the collimate lens 20 and being collimated. Among the collimate lights, only the laser lights being selected by the etalon 50 go through the etalon 50 and enter the grating 21 mounted in a Littrow arrangement. The collimate lights having entered the grating 21 are diffracted by the same angle as an incidence angle. Here, a Littrow arrangement is an arrangement with which only a light with a wavelength where incidence angle is equal to a diffraction angle can be selectively returned to the resonator. Diffracted lights with the wavelengths selected by the grating 21 are transmitted to the etalon 50 again and the wavelengths are selected. After that, the diffracted lights are collected via collimate lens 20, enter from one edge of the semiconductor device 1, and then are amplified by passing through the amplifiable lines S1 to S7 of the semiconductor device 1. After that, the lights amplified at the semiconductor device 1 are emitted from the other edge of the semiconductor device 1. Parts of the outputted lights pass through the output-coupling mirror 2, and then, are outputted from the beam splitter M50 as output laser lights. On the other hand, the reflected lights reflected at the output-coupling mirror 2 are amplified by passing through the amplifiable lines S1 to S7 of the semiconductor device 1 again, and are wavelength-selected by repeating the above-mentioned processes.

In addition, the resonator actuator 5$a$ changes the resonator length by actuating the PZT 54. The etalon actuator 5$b$ changes resonator intervals of the etalon 50 by rotating the etalon 50 in order to change selecting wavelengths thereof, for instance. The grating actuator 5$c$ changes a wavelength selecting region by rotating the grating 21. The spectrum detector 56 detects spectra of parts of the laser lights reflected by the beam splitter M50.

Here, multiple-longitudinal-mode laser lights outputted from the resonator of the semiconductor laser 61C will be described with reference to FIG. 15. In this eighth embodiment, the resonator length 'd' between the output-coupling mirror 2 and the grating 21 is longer than that in the second to seventh embodiments. Therefore, the $L_{FSR}$ which is the longitudinal-mode interval FSR of the resonator is shorter than each of the wavelength intervals of the amplifiable lines S1 to S7 of the preamplifier PA and the main amplifier MA on a wavelength axis. As a result, a lot of longitudinal-mode LL will appear in each of the wavelength bands.

On the other hand, a band width $\Delta\lambda s$ of a wavelength selecting region E1 by the grating 21 is shown in the following formula (1).

$$\lambda s = \lambda/(2 \tan \beta) \cdot \theta \quad (1)$$

Here, a case in that the grating 21 is arranged so that the number of trenches in the grating 21 will be m=20/mm and the diffraction angle β will be β=6.08°, and a laser light with wavelength λ=10.6 μm enters the grating 21 with a spread angle θ=2.5 mrad will be supposed. In this case, the band width $\Delta\lambda s$ of the wavelength selecting region E1 shown in FIG. 15 is 0.120 μm (≈0.0206 μm×6). That is, the band width $\Delta\lambda s$ of the wavelength selecting region E1 of the grating 21 has the width for only selecting the amplifiable lines S1 to S7 of the preamplifier PA and the main amplifier MA.

The $E_{FSR}$ which is a longitudinal-mode interval of the etalon 50 is shown in the following formula (2).

$$E_{FSR} = \lambda^2/(2n1) \quad (2)$$

In the formula (2), 'n' is a refractive index in the optical path of the etalon 50, and '1' is a mirror interval of the etalon 50. Here, in order to make the etalon 50 form the wavelength selecting regions E21 to E27 with each wavelength interval being nearly equal to each of the wavelength intervals of the amplifiable lines S1 to S7 of the preamplifier PA and the main amplifier MA, an integration value 'n1' of the refractive index 'n' in the optical path of the etalon 50 and the mirror interval '1' in the etalon 50 should be designed to be 2.8 mm.

The longitudinal-mode interval $L_{FSR}$ of the above-mentioned resonator is shown in the following formula (3).

$$L_{FSR} = \lambda^2/(2nd) \quad (3)$$

Here, 'n' is a refractive index of the resonator, and 'd' is a resonator length. Accordingly, as shown in the following formula (4), the resonator length 'd' is designed so that the $E_{FSR}$ as being the longitudinal-mode interval FSR of the etalon 50 is to correspond to the integral multiple of $L_{FSR}$ as being the longitudinal-mode interval FSR of the resonator. In the formula (4), 'm' is integer number.

$$E_{FSR} = m \cdot L_{FSR} \quad (4)$$

Figure 15:
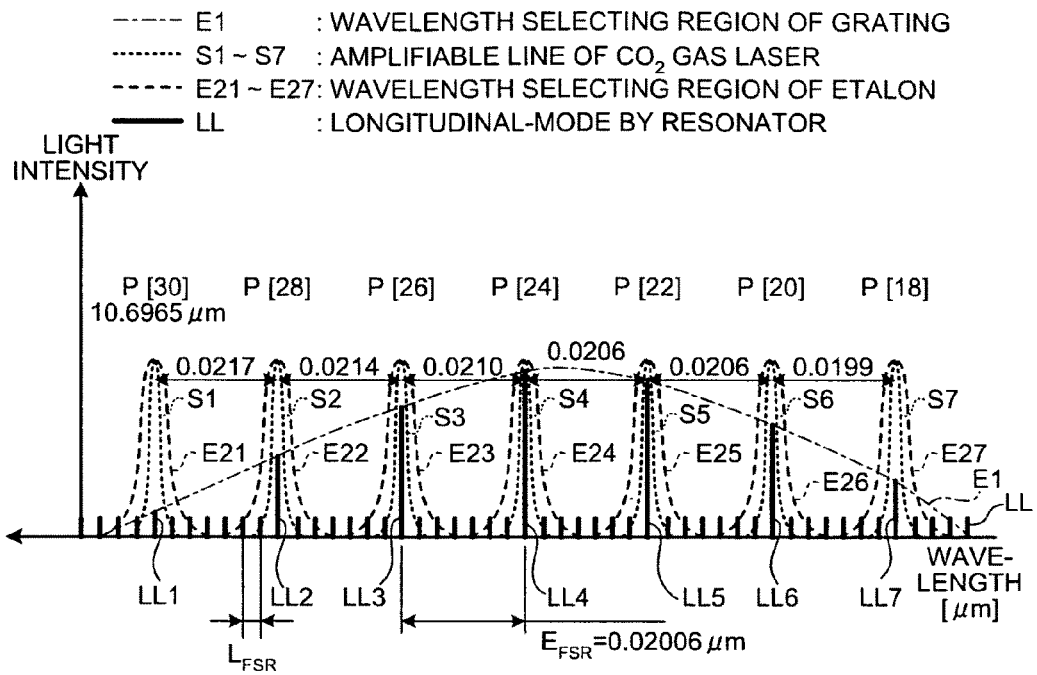
FIG. 15 is an image showing a graph of a relationship among amplifiable lines of the preamplifier and the main amplifier, the oscillating longitudinal-mode of the semiconductor laser and a wavelength selecting region of an etalon according to the eighth embodiment of the present invention.

By arranging the grating 21, the etalon 50 and the resonator length 'd' of the semiconductor laser 61C based on the formulas (1) to (4), it is possible to resonant-amplify the multiple-longitudinal-mode pulse laser lights LL1 to LL7 shown in FIG. 15. Here, the number of the longitudinal-modes oscillating on the resonator is seven, which is a necessity minimum value for amplification. Therefore, it is possible to effectively transduce the energy inputted to the semiconductor device 1 into the longitudinal-mode laser lights which are to be amplified.

Figure 16:
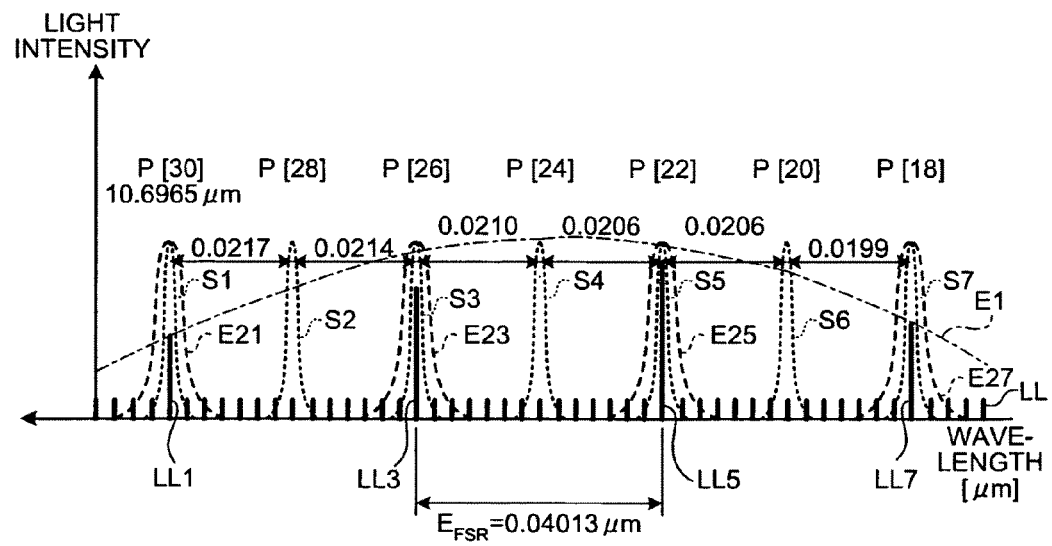
FIG. 16 is an image showing a graph of a relationship among amplifiable lines of the preamplifier and the main amplifier, the oscillating longitudinal-mode of the semiconductor laser and a wavelength selecting region of an etalon according to an alternate example of the eight embodiment of the present invention.

In addition, when the $E_{FSR}$ being the longitudinal-mode interval FSR of the etalon 50 is twice the $E_{FSR}$ (=0.04013 μm) shown in FIG. 15, specifically, when the optical interval 'n1' of the etalon 50 is 1.4 mm, as shown in FIG. 16, the number of the wavelength selecting regions of the etalon 50 is reduced to half (the wavelength selecting regions E21, E23, E25 and E27). In this arrangement, these wavelength selection regions E21, E23, E25 and E27 are adjusted to alternately adjacent amplifiable lines S1, S3, S5 and S7. As a result, it is possible to amplify only the four multiple-longitudinal-mode pulse laser lights LL1, LL3, LL5 and LL7. In addition, as shown in the formula (4), the $E_{FSR}$ as being the longitudinal-mode FSR of the etalon 50 is designed so that the $E_{FSR}$ corresponds to the integral multiple of the $L_{FSR}$ which is the longitudinal-mode interval of the resonator.

Figure 17:
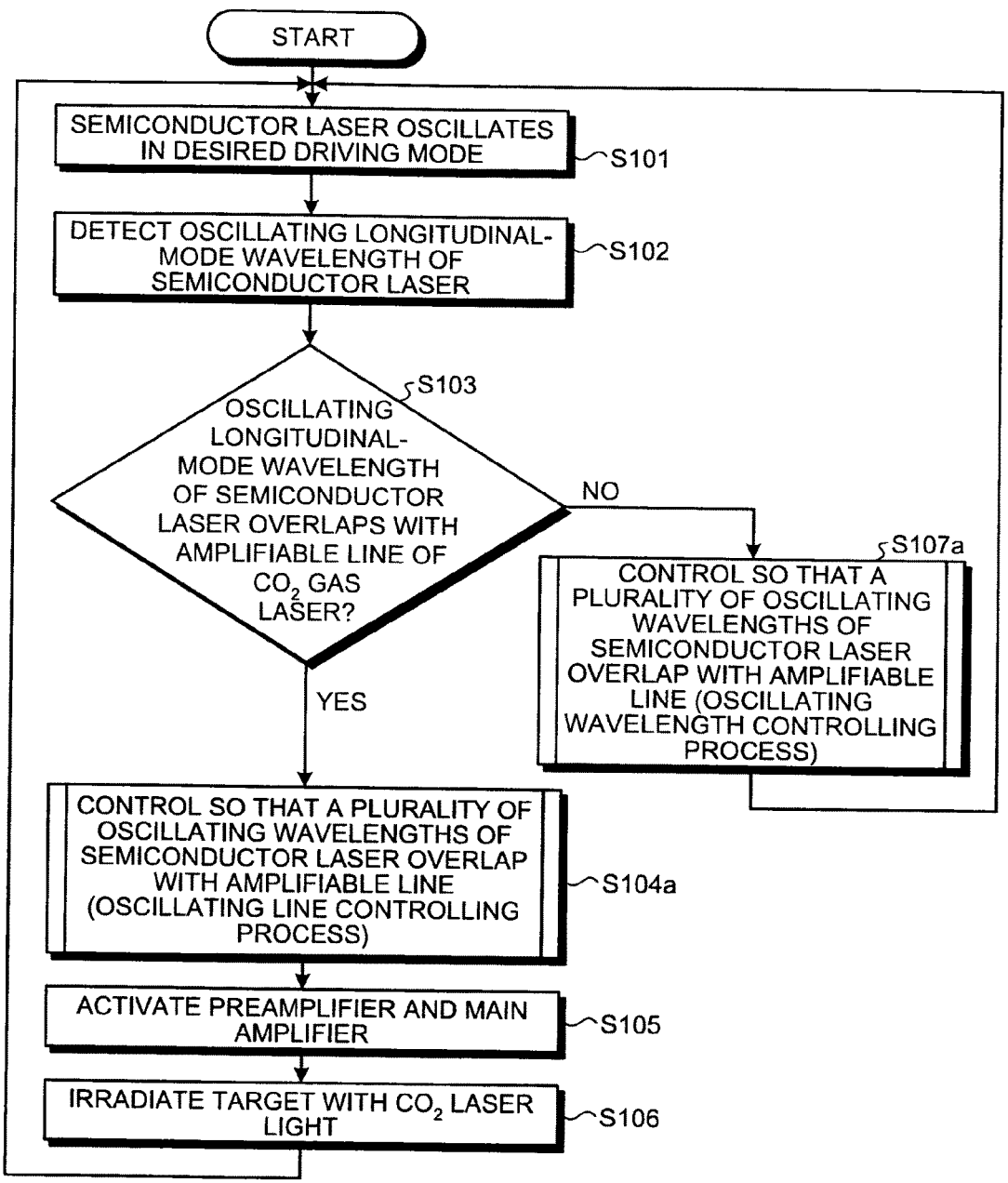
FIG. 17 is a flowchart showing a whole wavelength controlling process by a longitudinal-mode controller shown in FIG. 14.

Here, a wavelength controlling process according to the eighth embodiment will be described in detail with reference to flowcharts shown in FIGS. 17 and 18. FIG. 17 is a flowchart showing a whole wavelength controlling process according to the eight embodiment. In this eighth embodiment, the same process as the wavelength controlling process shown in FIG. 10 is executed. However, in place of steps S104 and S107, a control for adjusting a plurality of oscillating wavelengths in the semiconductor 61C to the amplifiable lines S1 to S7 will be executed (steps S104a and S107a).

Figure 18:
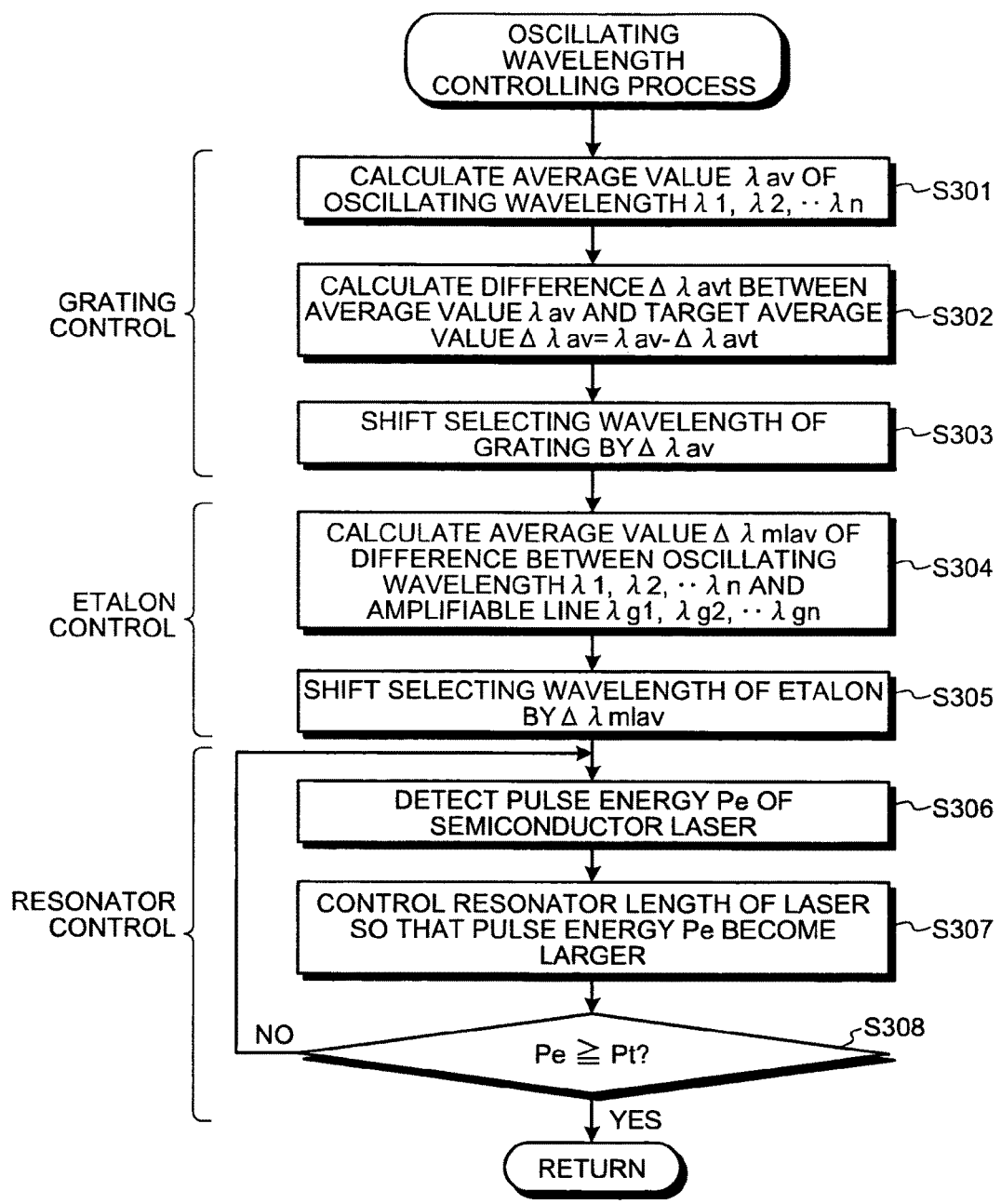
FIG. 18 is a flowchart showing a detailed oscillation wavelength controlling process shown in FIG. 17.

FIG. 18 is a flowchart showing a detailed oscillating wavelength controlling process shown in FIG. 17. The oscillating wavelength controlling process is executed under control of the longitudinal-mode controller 4. Therefore, the following explanations will focus on operation of the longitudinal-mode controller 4. As shown in FIG. 18, firstly, the longitudinal-mode controller 4 calculates an average value $\lambda av$ ($=(\lambda 1, \lambda 2, \ldots, \lambda n)/n$) among the oscillating wavelengths $\lambda 1, \lambda 2, \ldots, \lambda n$, which are to be oscillated in the amplifiable lines S1 to S7, respectively, based on the spectra detected by the spectrum detector 56 (step S301). Furthermore, the longitudinal-mode controller 4 calculates a difference $\Delta \lambda av$ ($=\lambda av - \lambda avt$) between the average value $\lambda av$ and a target average value $\lambda avt$ (step S302). After that, the longitudinal-mode controller 4 rotates the grating 21 by driving the grating actuator 5c in order to change the selecting wavelength by $\Delta \lambda av$ (step S303).

After that, the longitudinal-mode controller 4 calculates an average value $\Delta \lambda mlav$ of differences between the oscillating wavelengths $\lambda 1, \lambda 2, \ldots, \lambda n$ and the amplifiable lines $\lambda g1, \lambda g2, \ldots, \lambda gn$ (step S304). That is, the longitudinal-mode controller 4 calculates the average value $\Delta \lambda mlav=(\Delta \lambda m11+\Delta \lambda m12+ \ldots +\Delta \lambda m1n)/n$ under a condition that a difference $\Delta \lambda mln$ between each of the oscillating wavelength and each of the amplifiable region wavelength is $\Delta \lambda mln=(\lambda n-\lambda gn)$. After that, the longitudinal-mode controller 4 rotates the etalon 50 by driving the etalon actuator 5b in order to change the selecting wavelength of the etalon 50 by $\Delta \lambda mlav$ (step S305).

Furthermore, the longitudinal-mode controller 4 makes the spectrum detector 56 execute a process for specifying a pulse energy Pe based on the detected spectra (step S306), and then, fine adjust the resonator length 'd' by driving the PZT 54 from the resonator actuator 5a for changing a position of the output-coupling mirror 2 so that the pulse energy Pe becomes larger (step S307). After that, the longitudinal-mode controller 4 judges as to whether or not a pulse energy Pe specified from a newly-detected spectrum is equal to or more than a predetermined energy value Pt (step S308). If the pulse newly-detected energy Pe is less than the predetermined energy value Pt (step S308; No), the longitudinal-mode controller 4 returns to step S306, and executes the control for changing the resonator length 'd' again. On the other hand, if the newly-detected pulse energy Pe is equal to or more than the predetermined energy value Pt (step S308; Yes), the longitudinal-mode controller 4 finishes this operation and returns to step S104a or S107a.

In addition, the above-mentioned spectrum detector 56, for instance, can be structured using a grating type spectroscope, an etalon spectroscope or an interferometer. Moreover, in the eighth embodiment, the resonator length 'd' is finely adjusted by driving the PZT 54, to which the output-coupling mirror 2 is attached, using the resonator actuator 5a. However, it is not limited to such arrangement. It is also possible to arrange such that the substantial resonator length is finely adjusted by controlling a refractive index 'n' of the optical path in the amplifiable region by temperature control of the semiconductor device 1. That is, it is acceptable that the resonator actuator 5a can execute a control for elongating and contracting the substantial resonator length. Furthermore, the etalon actuator 5b can be designed to control a setting angle of the etalon 50, to mechanically control the mirror interval or the optical path length between the mirrors of the etalon 50 using a PZT, etc, or to control the substantial optical path length between the mirrors of the etalon 50 by temperature control. On the other hand, the grating actuator 5c can be structured by mounting the grating 21 on a rotatable stage for changing an incidence (=diffraction) angle of the grating 21.

The above-mentioned eighth embodiment has shown the case where the wavelength selecting region E1 of the grating 21 is fixed. However, it is not limited to such structure. A structure in that the wavelength selecting region of the grating 21 is set to a broad range and one or more amplifiable lines including the wavelength selecting region are arbitrarily selected by the etalon 50 can also be applied. In this case, the semiconductor laser 61C outputs longitudinal-mode pulse laser light of which number corresponds to the number being selected by the etalon 50 (optimally 3 to 7).

Ninth Embodiment

Next, a ninth embodiment of the present invention will be described in detail. The semiconductor lasers 61, 61A, 61B and 61C according to the above-mentioned second to eighth embodiments have the semiconductor device 1, the output-coupling mirror 2 and the rear optical module 3/53, and they are structured so that the resonator constructed from these elements oscillates in the multiple-longitudinal-mode. In contrast, in the ninth embodiment, in place of the semiconductor laser that oscillates in the multiple-longitudinal-mode, a laser apparatus, having a plurality of semiconductor lasers each of which oscillates in a single-longitudinal-mode for outputting a laser light with a wavelength in one of the amplifiable lines of the preamplifier PA and the main amplifier MA and outputs a combined light produced by combining the laser lights from the semiconductor lasers, is used. In the following, the same reference numbers will be used for the structural elements that are the same as the first embodiment, and redundant explanations of those structural elements will be omitted.

Figure 19:
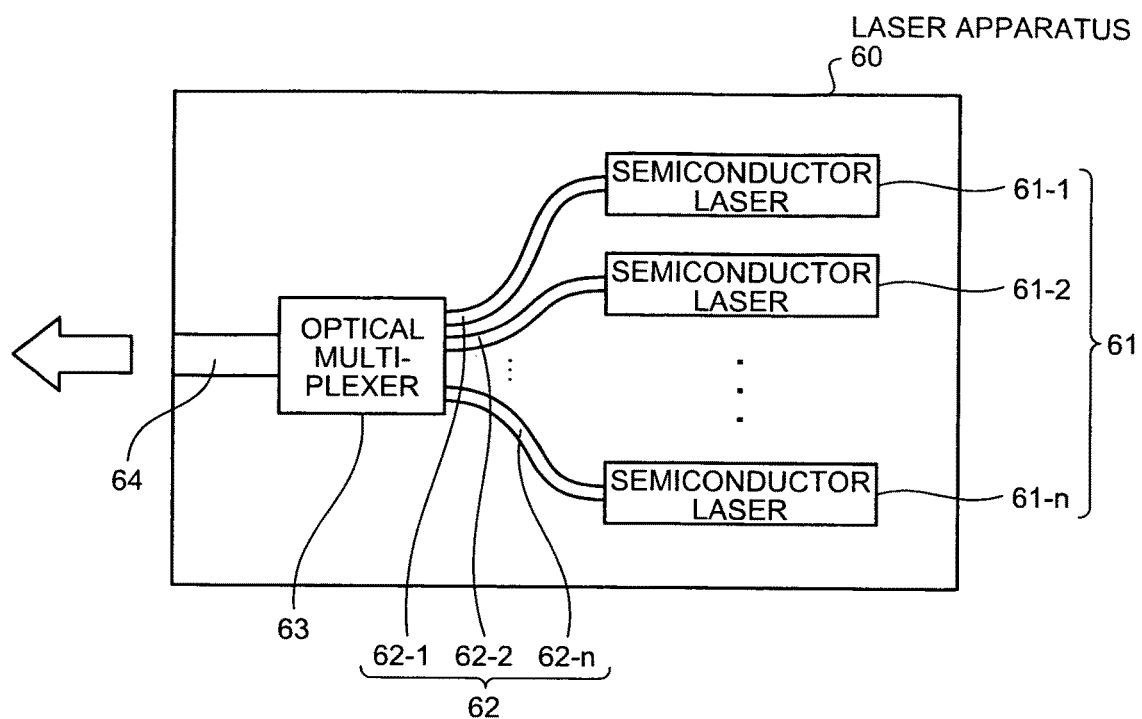
FIG. 19 is a schematic diagram showing a structure of a laser apparatus used for an extreme ultraviolet light source apparatus according to a ninth embodiment of the present invention.

FIG. 19 is a schematic diagram showing a structure of a laser apparatus used for an extreme ultraviolet light source apparatus according to the ninth embodiment of the present invention. The semiconductor laser 61 has a plurality of semiconductor lasers 61-1 to 61-n (hereinafter these semiconductor lasers will be referred to as semiconductor lasers 61 as long as differentiation is not necessary) each of which oscillates in a single-longitudinal-mode for outputting a laser light with a wavelength in one of the amplifiable lines S1 to S7 of the above-mentioned preamplifier PA and the main amplifier MA, and an optical combiner 63 for combining the laser lights from the semiconductor lasers 61. Between each semiconductor laser 61 and one end side of the optical combiner 63, waveguides 62-1 to 62-n (hereinafter these waveguides will be referred to as waveguides 62 as long as differentiation is not necessary) are located, respectively. At the other end side of the optical combiner 63, an output waveguide 64 is located. In addition, the semiconductor lasers 61, the waveguides 62, the optical combiner 63 and the output waveguide 64 can be built in one semiconductor substrate together.

The oscillating wavelength of each of the semiconductor lasers 61 is adjusted approximately to one of the amplifiable lines S1 to S7 of the preamplifier PA and the main amplifier MA. However, because the refractive index of the amplifiable region in each semiconductor laser 61 can change by temperature shift, or the like, oscillating wavelength of each semiconductor laser 61 can shift depending on temperature shift. Consequently, the longitudinal-mode controller 4 (not shown) mounted on each of the semiconductor lasers 61 can control the oscillating wavelength of one's semiconductor laser 61 by temperature control. In this arrangement, each semiconductor laser 61 can execute a feedback control independently.

Alternate Example 9-1

Figure 20:
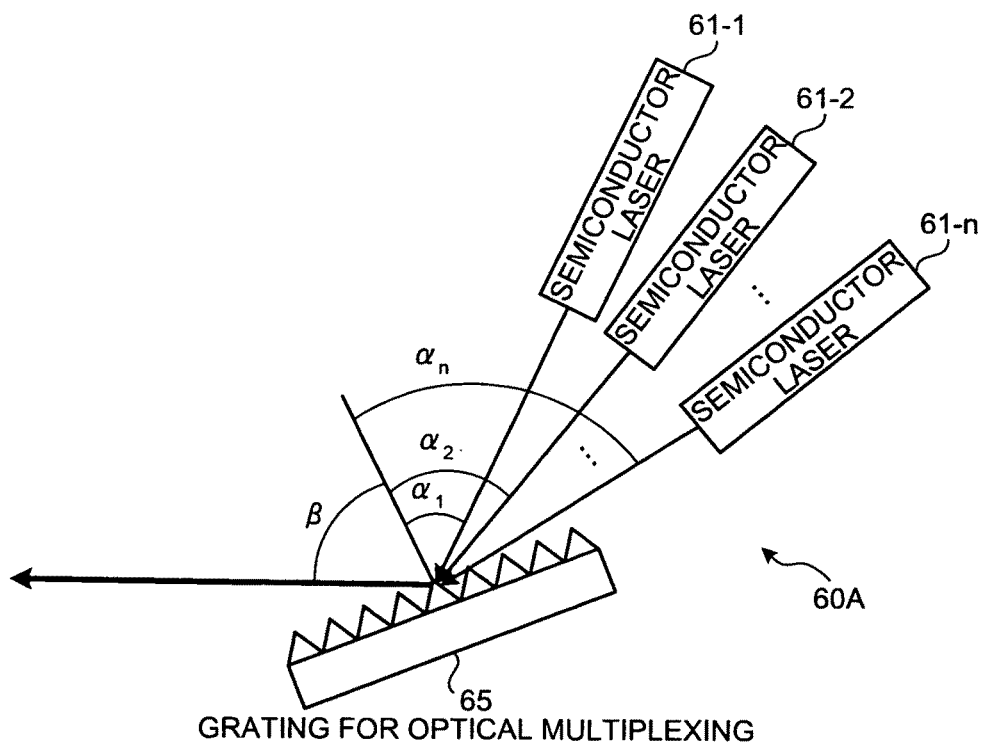
FIG. 20 is a schematic diagram showing a structure of a laser apparatus used for an extreme ultraviolet light source apparatus according to an alternate example of the ninth embodiment of the present invention.

FIG. 20 is a schematic diagram showing a structure of a laser apparatus used for an extreme ultraviolet light source apparatus according to an alternate example 9-1 of the ninth embodiment of the present invention. A difference between a laser apparatus 60A according to this alternate example 9-1 and the laser apparatus 60 shown in FIG. 19 is that the laser apparatus 60A has an optical combining grating 65 as the optical element functioning similarly to the optical combiner 63.

In dispersion by grating, the following formula (5) can be established between an incident angle α and a diffraction angle β.

In formula (5), 'm' is order, 'λ' is wavelength, and 'a' is interstitial distance.

$$m\lambda = a(\sin \alpha \pm \sin \beta) \quad (5)$$

In FIG. 20, each of the semiconductor lasers 61-1 to 61-$n$ oscillates a laser light with a wavelength in one of the amplifiable lines S1 to S7 of the preamplifier PA and the main amplifier MA in a single-longitudinal-mode. The laser lights outputted from the semiconductor lasers 61-1 to 61-$n$ enter the optical combining grating 65 with incidence angles α1, α2, ..., α$n$, respectively. The optical combining grating 65 outputs all of the laser lights from the semiconductor lasers 61-1 to 61-$n$ with a diffraction angle β. Accordingly, the laser lights outputted from the plurality of the semiconductor lasers 61 are combined.

Consequently, incidence angles α1, α2, ..., α$n$ and a diffraction angle β are to be set so that n number of formulas (5-1) to (5-$n$) shown in the following can be established.

$$m\lambda 1 = a(\sin \alpha 1 \pm \sin \beta) \quad (5\text{-}1)$$

$$m\lambda 2 = a(\sin \alpha 2 \pm \sin \beta) \quad (5\text{-}2)$$

$$m\lambda n = a(\sin \alpha n \pm \sin \beta) \quad (5\text{-}n)$$

Here, each of the oscillating wavelengths λ1, λ2, ..., λ$n$ on the semiconductor lasers 61 can be any of the oscillation lines of the preamplifier PA and the main amplifier MA shown in FIG. 3.

Alternate Example 9-2

Figure 21:
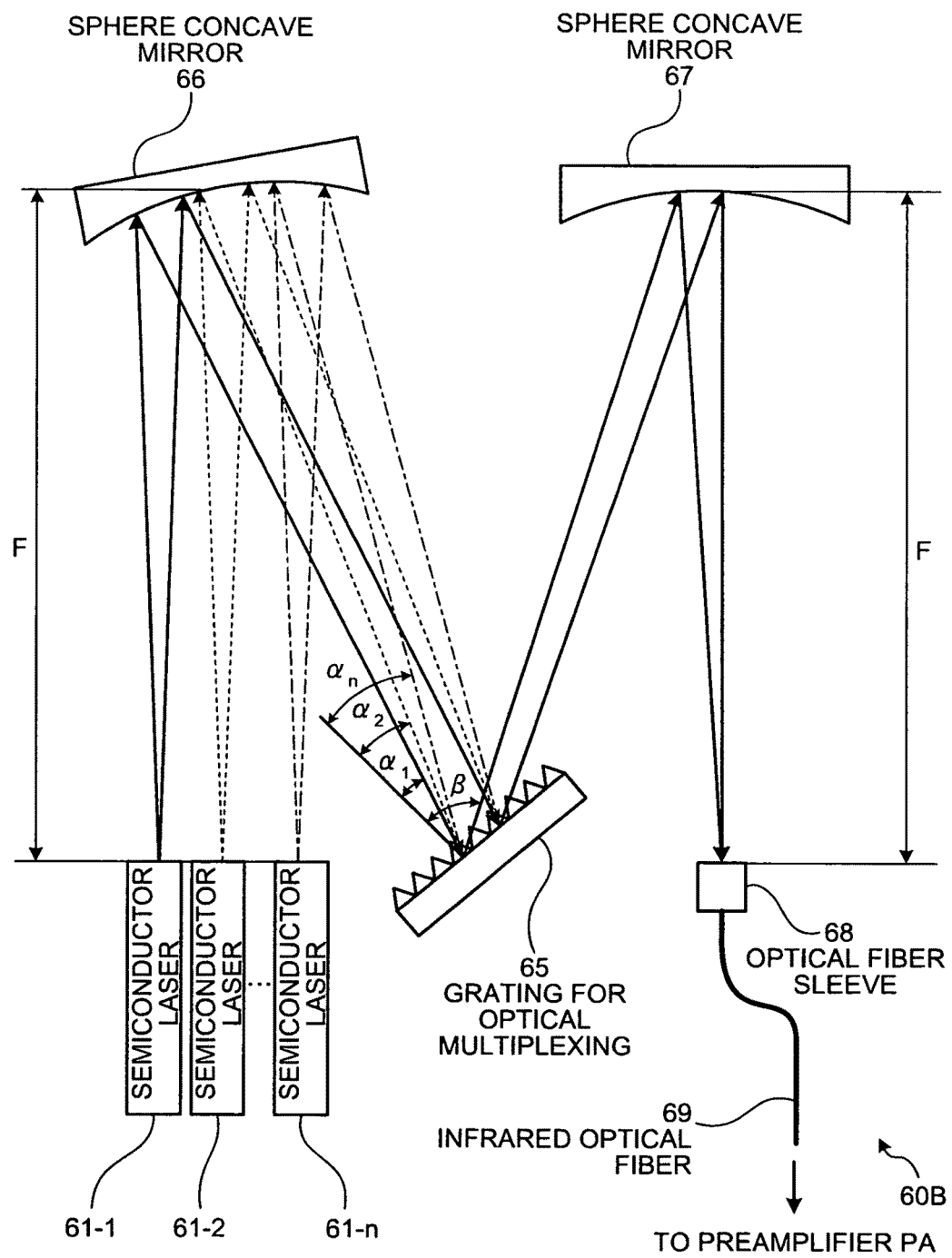
FIG. 21 is a schematic diagram showing a structure of a laser apparatus used for an extreme ultraviolet light source apparatus according to another alternate example of the ninth embodiment of the present invention.

In the alternate example 9-1 mentioned above, the case in that the plurality of semiconductor lasers 61 are arranged in a circular arc along a circle of which center is a point on a diffraction surface of the optical combining grating 65 has been described as an example. However, it is not limited to such arrangement. As shown in FIG. 21, it is also possible that the plurality of semiconductor lasers 61 are arranged so that output directions of the laser lights from the semiconductor lasers 61 are aligned in parallel. FIG. 21 is a schematic diagram showing a structure of a semiconductor laser 61B used for an extreme ultraviolet light source apparatus according to another alternate example 9-2 of the present invention. As shown in FIG. 21, the semiconductor laser 60B has a plurality of semiconductor lasers 61-1 to 61-$n$, a sphere concave mirror 66, the optical combining grating 65, a sphere concave mirror 67, and an infrared optical fiber 69. The plurality of semiconductor lasers 61-1 to 61-$n$ (61) are arranged in a parallel manner so that the output directions of the laser lights are aligned in parallel. The sphere concave mirror 66 reflects the laser lights outputted from the semiconductor laser 61-1 to 61-$n$ in such a way that reflected laser lights become collimate lights. The optical combining grating 65 diffracts the collimate lights from the sphere concave mirror 66. The sphere concave mirror 67 reflects the collimate lights diffracted by the optical combining grating 65 in such a way that the reflected lights are collected. The infrared optical fiber 69 receives the laser lights collected by the sphere concave mirror 67 via the optical fiber sleeve 68 and waveguides the laser light to the preamplifier PA. In addition, the laser light outputted from each of the semiconductor laser 61-1 to 61-$n$ enters the sphere concave mirror 66 while spreading. That is, a spot formed on the sphere concave mirror 66 by each of the semiconductor lasers 61-1 to 61-$n$ becomes a certain region having a certain degree of area, but not a dot. Accordingly, the n number of laser lights reflected by the sphere concave mirror 66 enter a redundant region on the diffraction surface of the optical combining grating 65 as collimate lights each having a predetermined spread, and are diffracted by the optical combining grating 65. In this arrangement, the semiconductor lasers 61 and the sphere concave mirrors 66 and 67 are arranged so that the n number of the laser lights (the collimate lights) entering the optical combining grating 65 and laser lights (the diffracted lights) diffracted by the optical combining grating 65 have a relationship that the incidence angles α1, α2, ..., α$n$ and the diffraction angle .beta. satisfy the above-mentioned formulas (5-1) to (5-$n$). Thus, by making the diffraction angles β of the laser lights by the optical combining grating 65 become even, it is possible to combine the laser lights from the semiconductor lasers 61-1 to 61-$n$ as being reflected by the sphere concave mirror 66, for transforming the laser lights into the collimate lights each of which having the spread on the optical combining grating 65.

The collimate lights (the laser lights) from the optical combining grating 65, which are reflected by the sphere concave mirror 67, are reflected by the sphere concave mirror 67 so that the reflected laser lights are focused on a predetermined position (focus F). The optical fiber sleeve 68 is located on the focus F of the sphere concave mirror 67. Therefore, the laser lights focusing on the focus F are waveguided into the infrared optical fiber 69 via the optical fiber sleeve 68. The laser lights waveguided into the infrared optical fiber 69 are outputted to the preamplifier PA. Here, it is possible to use a relay optical system in place of the infrared optical fiber 69.

In the ninth embodiment, each of the individual semiconductor lasers 61-1 to 61-$n$ outputs the laser light of which wavelength corresponds to one of the amplifiable lines S1 to S7 of the preamplifier PA and the main amplifier MA. Therefore, it is possible to make the wavelength of the laser lights correspond with accuracy to the wavelengths of the amplifiable lines S1 to S7 using a simple structure. As a result, it is possible to improve an amplification efficiency of laser lights in the driver laser.

Tenth Embodiment

Next, a tenth embodiment of the present invention will be described in detail. In the above-mentioned first to ninth embodiments, the laser lights outputted from the semiconductor laser 61/61A/61B/61C are outputted to the preamplifier PA without modification. On the other hand, in the tenth embodiment, a regenerative amplifier for amplifying laser lights outputted from a semiconductor laser is located between the semiconductor laser and the preamplifier PA. In the following description, although a case in that the semiconductor laser 61 is used will be described in detail, other semiconductor laser 61A/61B/61C can also be used in place of the semiconductor laser 61. Moreover, in the following, the same reference numbers will be used for the structural elements that are the same as the first embodiment, and redundant explanations of those structural elements will be omitted.

Figure 22:
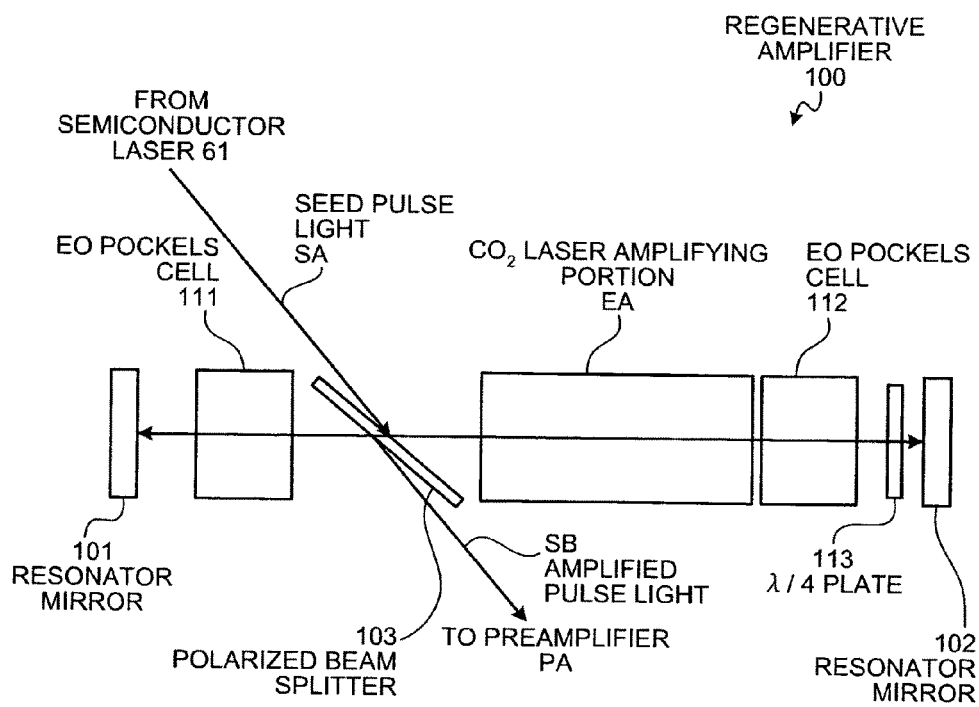
FIG. 22 is a schematic diagram showing a structure of a regenerative amplifier used for an extreme ultraviolet light source apparatus according to a tenth embodiment of the present invention.

FIG. 22 is a schematic diagram showing a structure of a regenerative amplifier 100 used for an extreme ultraviolet light source apparatus according to the tenth embodiment of the present invention. As described above, the regenerative amplifier 100 is located between the semiconductor laser 61 and the preamplifier PA, especially between the semiconductor laser 61 and the relay optical system R1 shown in FIG. 1. The regenerative amplifier 100 amplifies the laser lights outputted from the semiconductor laser 61 and outputs the amplified laser lights to the preamplifier PA.

As shown in FIG. 22, the regenerative amplifier 100 has a structure in that an EO Pockels cell 111, a polarized beam splitter 103, a $CO_2$ gas laser amplifier EA, an EO Pockels cell 112 and a λ/4 plate 113 located between a pair of resonator mirrors 101 and 102 while being arranged in this order from he resonator mirror 101. Among the laser lights outputted from the semiconductor laser 61, a predetermined polarization component (s-polarization component in this particular case) is reflected by the polarized beam splitter 103 and enters the regenerative amplifier 100 as a seed pulse light SA. The seed pulse light SA having entered the regenerative amplifier 100 is amplified while shuttling between the resonator mirrors 101 and 102, and then, is outputted to the preamplifier PA as an amplified pulse light SB by the polarized beam splitter 103.

Figure 23:
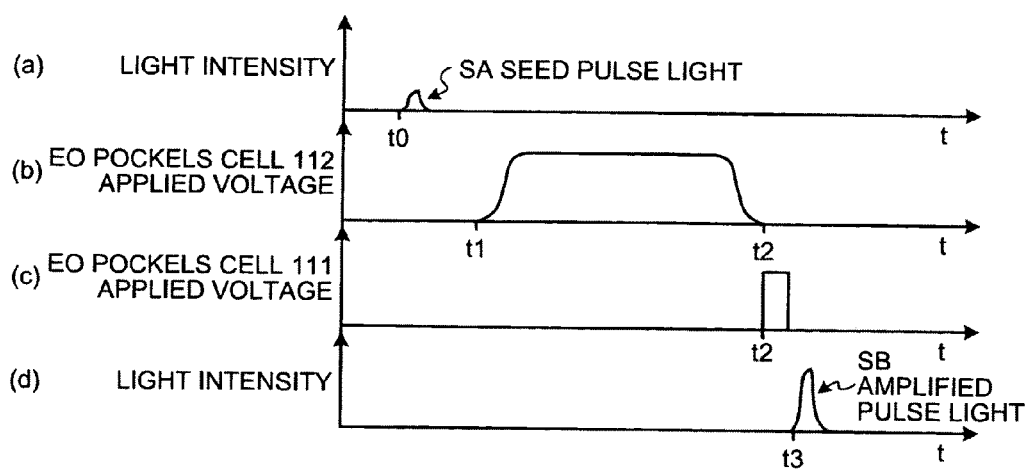
FIG. 23 is a timing chart showing an operation of the regenerative amplifier shown in FIG. 22.

Here, an operation of the regenerative amplifier 100 will be described in detail with reference to a timing chart shown in FIG. 23. Firstly, pulsed laser lights having outputted from the semiconductor laser 61 and entered into the polarized beam splitter 103 as the seed pulse laser lights SA at a timing t0 are waveguided to the regenerative amplifier 100 by being reflected by the polarized beam splitter 103. Here, the laser lights outputted from the semiconductor laser 61 are s-polarized lights. The laser lights waveguided into the resonator are amplified while passing through the amplifiable region of the $CO_2$ laser amplifier EA, pass through the voltage free EO Pockels cell 112 without being phase-shifted, and then are transformed into circular polarized laser lights by passing through the λ/4 plate 113. The circular polarized laser lights are highly-reflected by the resonator mirror 102, and enter the λ/4 plate 113 again. The λ/4 plate 113 transforms the entered circular polarized laser lights into p-polarized laser lights. The p-polarized laser lights pass through the voltage free EO Pockels cell 112 without being phase-shifted, and then are amplified by passing through the amplifiable region of the $CO_2$ laser amplifier EA again.

The amplified p-polarized laser lights pass through the polarized beam splitter 103, pass through the voltage free EO Pockels cell 111 without being phase-shifted, and then are highly-reflected by the resonator mirror 101. Then, the highly-reflected p-polarized laser lights pass through the voltage free EO Pockels cell 111 without being phase-shifted again, pass through the polarized beam splitter 103, and then are amplified by passing through the amplifiable region of the $CO_2$ laser amplifier EA again.

After that, a voltage is applied to the EO Pockels cell 112 at a timing t1. The voltage-applied EO Pockels cell 112 shifts a phase of passing laser lights by λ/4. Accordingly, the laser lights passing through the voltage-applied EO Pockels cell 112 are transformed into circular polarized laser lights. The circular polarized laser lights are subsequently transformed into s-polarized laser lights by passing through the λ/4 plate 113. Then, the s-polarized laser lights are reflected by the resonator mirror 102, and then are transformed into circular polarized laser lights by passing through the λ/4 plate 113 again. Furthermore, the circular polarized laser lights are transformed into p-polarized laser lights again by passing through the voltage-applied EO Pockels cell 112. Then, the p-polarized laser lights are amplified by passing through the amplifiable region of the $CO_2$ laser amplifier EA. Then, the amplified p-polarized laser lights pass through the polarized beam splitter 103, pass through the voltage free EO Pockels cell 111 without being phase-shifted, and then are reflected by the resonator mirror 101 at p-polarized states. After that, the reflected p-polarized laser lights pass through the voltage free EO Pockels cell 111 again without being phase-shifted, and then pass through the polarized beam splitter 103 at p-polarized states. In the manner mentioned above, the laser lights are amplified by shuttling between the resonator mirrors 101 and 102 while voltage is being applied to the EO Pockels cell 112.

After that, a voltage is applied to the EO Pockels cell 111 at a timing t2 for outputting the amplified pulse lights PA. The p-polarized laser lights are transformed into circular polarized laser lights by the phase shifted by λ/4 when passing through the voltage-applied EO Pockels cell 111. Furthermore, the circular polarized laser light are reflected by the resonator mirror 101, and are transformed into s-polarized laser lights by passing through the voltage-applied EO Pockels cell 111 again. The s-polarized laser lights are highly-reflected by the polarized beam splitter 103, and are outputted to the preamplifier PA as amplified pulse laser lights SB.

By using the regenerative amplifier 100 as mentioned above, it is possible to amplify pulse laser lights from a low power light source such as the semiconductor laser 61 before outputting the laser lights to the preamplifier PA. Thereby, it is possible to obtain highly-efficient pulse-amplification in the preamplifier PA and the main amplifier MA.

Figure 24:
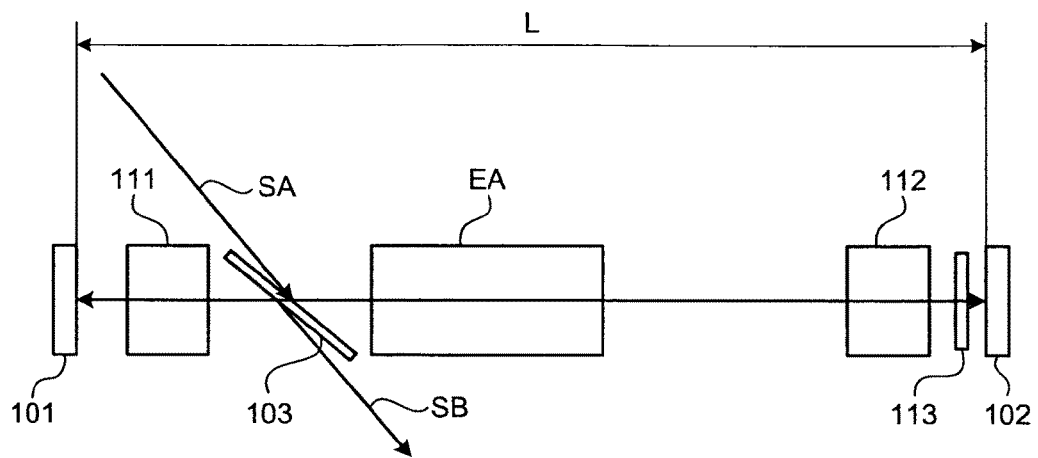
FIG. 24 is a schematic diagram showing a resonator length of the regenerative amplifier shown in FIG. 22.

Here, assuming that a time width of each of the seed pulse lights SA is Tsem, it is desirable that the resonator length L (shown in FIG. 24) of the regenerative amplifier 100 fulfills the following formula (6). In the formula (6), 'C' is the light speed.

$$2L/C \geq Tsem \quad (6)$$

By setting the resonator length L to fulfill the formula (6), it is possible to prevent a longitudinal-mode from generating depending on the resonator length of the regenerative amplifier 100. That is, deformation and destabilization of a pulse shape due to disruption of the pulse shape, or the like, resulting from lights interfering at a time of resonance in the resonator of the regenerative amplifier 100 can be prevented. As a result, it is possible to stably amplify the seed pulse light SA while maintaining the wave shape. In addition, in the tenth embodiment, it is possible to stably control a prevention of generation of a longitudinal-mode (interference light) without controlling to adjust the resonator length L of the regenerative amplifier 100. Moreover, when the seed pulse lights SA with a plurality of wavelengths enter the regenerative amplifier 100 but the formula (6) are not satisfied, in order to amplify all of the seed pulse lights SA, it is required that wavelengths of longitudinal-mode laser lights generated depending on the resonator length of the regenerative amplifier 100 are adjusted to correspond with the wavelengths of the seed pulse lights SA. If these wavelengths did not correspond, it is not possible to amplify all of the seed pulse lights SA. As a result, the amplification efficiency will be reduced. On the other hand, by letting the formula (6) fulfilled, it is possible to amplify all of the seed pulse lights SA without adjusting the wavelengths of the longitudinal-mode laser lights generated depending on the resonator length of the regenerative amplifier 100 to correspond with the wavelengths of the seed pulse lights SA. As a result, high amplification efficiency can be obtained. Furthermore, by arranging such that pulse widths of the seed pulse lights SA become equal to or less than the time width Tsem determined based on the resonator length L of the regenerative amplifier 100, it is possible to freely adjust the pulse widths of the seed pulse lights SA by controlling shapes of current pulses for the semiconductor lasers 61. Thereby, it is possible to stably amplify the seed pulse lights SA with adjusted pulse widths using the regenerative amplifier 100.

Alternate Example 10-1

For instance, when the time width Tsem of each of the seed pulse lights SA is 20 ns, the resonator length L for fulfilling the formula (6) will be equal to or more than about 3 m.

Figure 25:
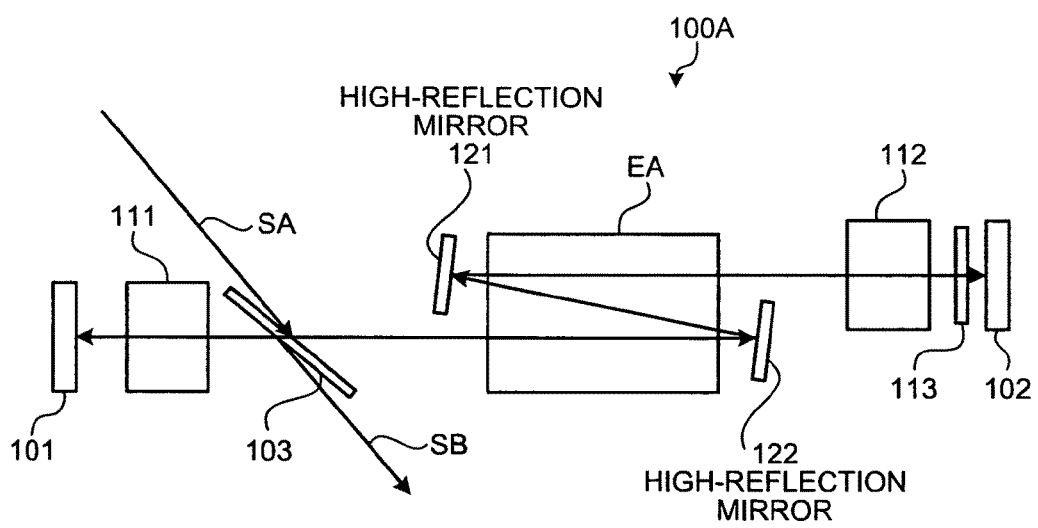
FIG. 25 is a schematic diagram showing a structure for elongating the resonator length while maintaining miniaturization of the regenerative amplifier shown in FIG. 22.

As for preventing the regenerative amplifier 100 from becoming larger in size due to the resonator length L becoming longer, as in a case of a regenerative amplifier 100A shown in FIG. 25, for instance, arrangement where a pair of highly-reflective mirrors 121 and 122 which sandwich the amplifiable region of the $CO_2$ laser amplifier EA is effective. By arranging the pair of the highly-reflective mirrors 121 and 122, it is possible to make the laser lights shuttle in the amplifiable region of the $CO_2$ laser amplifier EA. Thereby, it is possible to obtain the resonator length L that can fulfill the formula (6) even if a compact $CO_2$ laser amplifier EA is used. As a result, it is possible to not only downsize the regenerative amplifier 100, but also improve amplification efficiency per hour.

In addition, FIG. 25 shows the case in that the laser lights are made to shuttle once in the amplifiable region of the $CO_2$ laser amplifier EA using the highly-reflective mirrors 121 and 122. However, it is not limited to such arrangement. The laser lights can also be made to shuttle in the amplifiable region of the $CO_2$ laser amplifier EA more than once. Moreover, in FIG. 25, the laser lights pass through the amplifiable region of the $OC_2$ laser light three times. Nonetheless, in a condition without self-oscillation and parasitic-oscillation, it is possible to produce further multipass amplification in order to further improve amplification efficiency of the laser lights.

Furthermore, it is also possible to obtain the resonator length L that fulfills the formula (6) using a plurality of mirrors located outside the amplifiable region of the $CO_2$ laser amplifier EA.

Eleventh Embodiment

Next, an eleventh embodiment of the present invention will be described in detail. In the eleventh embodiment, a distributed feedback (DFB) type semiconductor laser is used for a semiconductor laser as a master oscillator.

Figure 26:
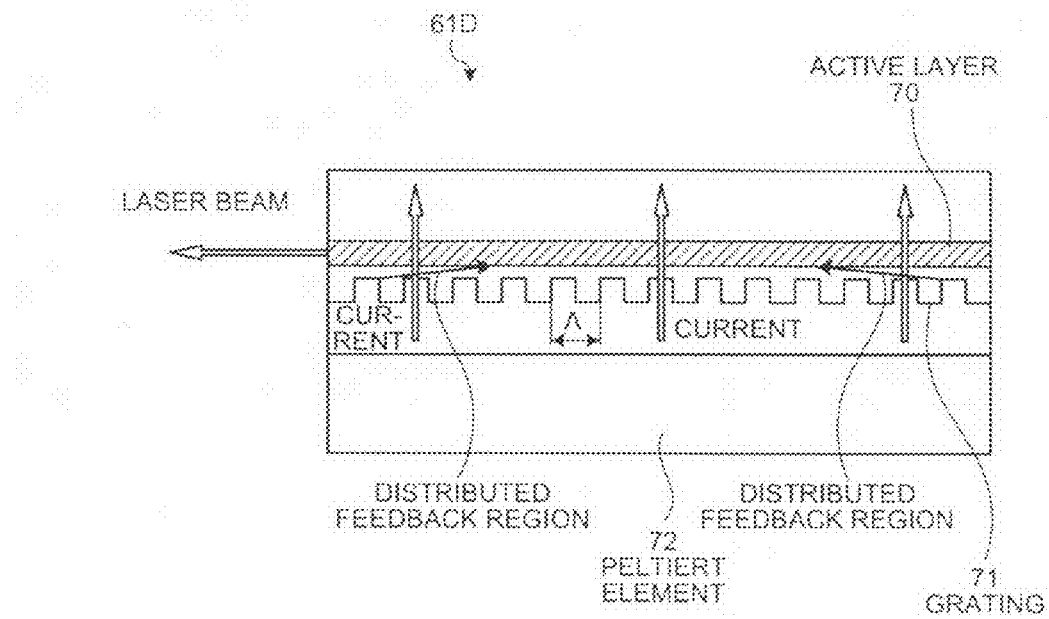
FIG. 26 is a cross-sectional schematic diagram showing an outline structure of a distributed feedback (DFB) type semiconductor laser applied for a semiconductor laser according to an eleventh embodiment of the present invention.

FIG. 26 is a cross-sectional schematic diagram showing an outline structure of a distributed feedback (DFB) type semiconductor laser 61D applied to a semiconductor laser as a master oscillator according to the eleventh embodiment of the present invention. The semiconductor laser 61D has an active layer 70 generating a laser light, and a grating 71 selecting a wavelength of the laser light generated in the active layer 70. The grating 71 is formed near the active layer 70 (over or under the active layer 70). A wavelength of maximum reflection by the grating 71 can be expressed, in general, by the following formula (7).

$$\lambda = \lambda b \pm \delta\lambda \qquad (7)$$

Here, $\lambda b = 2n\Lambda/m$ is a wavelength of Bragg reflection, '$\Lambda$' is a cycle of the grating, and 'In' is diffraction order. According to the formula (7), a wavelength width selected by the grating 71 (hereinafter to be referred to as selecting wavelength width) is $2\delta\lambda$. The selecting wavelength width $2\delta\lambda$ is a value decided based on a depth of trenches of the grating 71, the resonator length of the semiconductor laser 61D, and so on. Consequently, by arranging such that only one longitudinal-mode in the semiconductor laser 61D is included in the selecting wavelength width $2\delta\lambda$ of the grating 71, it is possible to oscillate the semiconductor laser 61D in a single-longitudinal-mode. Control of the single-longitudinal-mode and oscillating wavelength of the single-longitudinal-mode can be realized by controlling temperature of the semiconductor laser 61D (especially the active layer 71) using a Peltier element 72 so that the wavelength of the single-longitudinal-mode is made stable in one of the amplifiable lines S1 to S7 of the preamplifier PA and the main amplifier MA shown in FIG. 4. Thereby, it is possible to amplify the laser light of the single-longitudinal-mode.

Moreover, it is possible to oscillate the semiconductor laser 61D in a multiple-longitudinal-mode by forming the grating 71 over or under the active layer 70 so that the selecting wavelength width $2\delta\lambda$ becomes the selecting wavelength region E1 as shown in FIG. 15 and by arranging so that the wavelength interval $L_{FSR}$ between the longitudinal-modes of the semiconductor laser 61D becomes 0.0206 μm. As a result, it is possible to oscillate the semiconductor laser 61D simultaneously in a multiple-longitudinal-modes for outputting the laser lights of which wavelengths correspond to the seven (plural) amplifiable lines S1 to S7 of the preamplifier PA and the main amplifier MA, respectively. The longitudinal-mode control for this case can be realized by adjusting temperature of the semiconductor laser 61D using the Peltier element 72, or the like, with high accuracy. Advantages according to this system are that spectra of the oscillating laser lights can be stabilized with compact and high power. This is because no etalons or gratings are required in the external resonator, as the eight embodiment shown in FIG. 14.

In the eleventh embodiment, because the distributed feedback (DFB) type semiconductor laser 61D is used, it is possible to output laser lights with sufficient narrowness and high intensity as compared to the amplifiable line width $\Delta\lambda$ of the amplifiable lines S1 to S7 of the preamplifier PA and the main amplifier MA. Accordingly, an optimum semiconductor laser 61D as a master oscillator can be realized.

Twelfth Embodiment

Next, a twelfth embodiment of the present invention will be described in detail. In the laser apparatus 60A according to the above-mentioned alternate example 9-1 of the ninth embodiment, the output edges of the semiconductor lasers 61 are used as the output ends of the laser lights which are to be combined. Therefore, in the alternate example 9-1, the semiconductor lasers 61-1 to 61-n (61) should be arranged so that the output edges thereof are arrayed in a circular arc. On the other hand, in the twelfth embodiment, output ends (pigtail) of optical fibers attached to the semiconductor lasers 61-1 to 61-n (61) are used as the output ends of the laser lights which are to be combined. By this arrangement, in the twelfth embodiment, it is not necessary to arrange the semiconductor lasers 61 in such a way that the output edges thereof are arrayed in a circular arc. As a result, it is possible to downsize the laser apparatus. In the following, the same reference numbers will be used for the structural elements that are the same as the first embodiment, and redundant explanations of those structural elements will be omitted.

Figure 27:
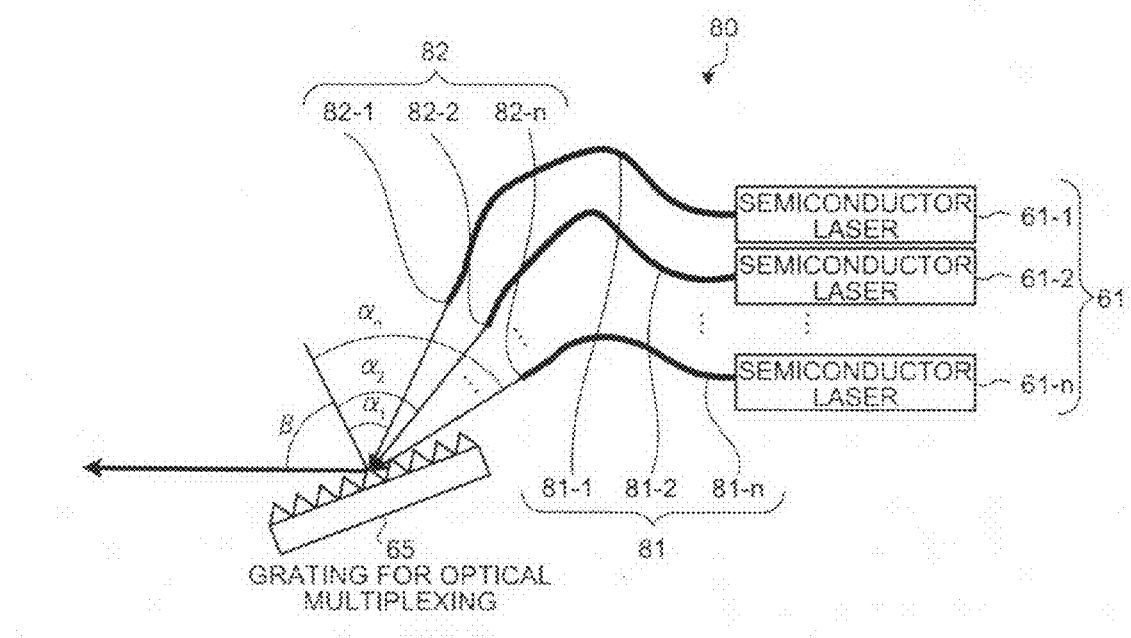
FIG. 27 is a schematic diagram showing a structure of a laser apparatus used for an extreme ultraviolet light source apparatus according to a twelfth embodiment of the present invention.

FIG. 27 is a schematic diagram showing a structure of a laser apparatus 80 used for an extreme ultraviolet light source apparatus according to the twelfth embodiment of the present invention. As with the laser apparatus 60A shown in FIG. 20, the laser apparatus 80 has a plurality of semiconductor lasers 61-1 to 61-n (61) and the optical combining grating 65. Moreover, the laser apparatus 80 has the same structure as the laser apparatus 60A, but further has pigtails 81-1 to 81-n (hereinafter these pigtails will be referred to as pigtails 81 as long as differentiation is not necessary) waveguiding the laser lights from the semiconductor lasers 61-1 to 61-n (61).

One ends of the pigtails 81-1 to 81-n are attached to the output edges of the semiconductor lasers 61-1 to 61-n, respectively. The laser lights outputted from the semiconductor lasers 61 enter from one ends of the pigtails 81, propagate inside the pigtails 81, respectively, and then are emitted from the other output ends 82-1 to 82-n (hereinafter these output ends will be referred to as output ends 82 as long as differentiation is not necessary) of the pigtails 81, respectively.

The output ends 82-1 to 82-n (82) of the pigtails 81-1 to 81-n (81) are arranged in a circular arc along a circle of which center is a point on a diffraction surface of the optical combining grating 65. In this arrangement, the output ends 82-1 to 82-n are fixed so that the laser lights from the semiconductor lasers 61-1 to 61-n, each of which oscillating in a single-longitudinal-mode for outputting the laser light of which wavelength includes one of the amplifiable lines S1 to S7 of the preamplifier PA and the main amplifier MA, enter the optical combining grating 65 with the incidence angles $\alpha 1$, $\alpha 2, \ldots, \alpha n$, respectively. That is, the output ends 82 are fixed so that the above-mentioned formulas (5-1) to (5-n) are to be fulfilled. As a result, the optical combining grating 65 outputs all of the laser lights entering from the output ends 82 of the pigtails 81 with the diffraction angle $\beta$. Thereby, the laser lights outputted from the plurality of the semiconductor lasers 61 are combined on the optical combining grating 65.

Here, a size (diameter, for instance) of each output end 82 of the pigtail 81 is sufficiently small as compared to a size of each semiconductor laser 61. Therefore, it is possible to locate the output ends 82 of the pigtails 81, which are the output ends of the laser lights, closely to the optical combining grating 65. Moreover, the pigtails 81 as being optical fibers can be bended. Therefore, it is possible to freely arrange the locations of the semiconductor lasers 61. For such arrangement as mentioned, in the twelfth embodiment, design freedom of the laser apparatus 80A can be enhanced. As a result, it becomes possible to downsize the laser apparatus 80A.

Furthermore, in the twelfth embodiment, because the output ends 82 of the pigtails 81 are used as the output ends of the laser lights from the semiconductor lasers 61, it is possible to improve quality of special coherence of optical combining wave surfaces by downsizing the diameters of the output ends 82. Furthermore, in the twelfth embodiment, as with the case of the above-mentioned other embodiments, the laser light entering the infrared optical fiber 69 is a combined light. Therefore, by monitoring intensity per wavelength of the combined laser light outputted from the infrared optical fibers 69, it is possible to easily detect as to whether or not the laser lights are accurately combined. Since the rest of the structures, operations and effects of the laser apparatus and the extreme ultraviolet light source apparatus are the same as those of the laser apparatuses and the extreme ultraviolet light source apparatuses according to the above-mentioned embodiments, a detailed description thereof will be omitted.

Thirteenth Embodiment

Next, a thirteenth embodiment of the present invention will be described in detail. The thirteenth embodiment has the same structure as the twelfth embodiment, but the optical combining grating 65 in the structure according to the twelfth embodiment is arranged to a state of Littrow arrangement or an approximate Littrow arrangement. In the following, the same reference numbers will be used for the structural elements that are the same as the first embodiment, and redundant explanations of those structural elements will be omitted.

Figure 28:
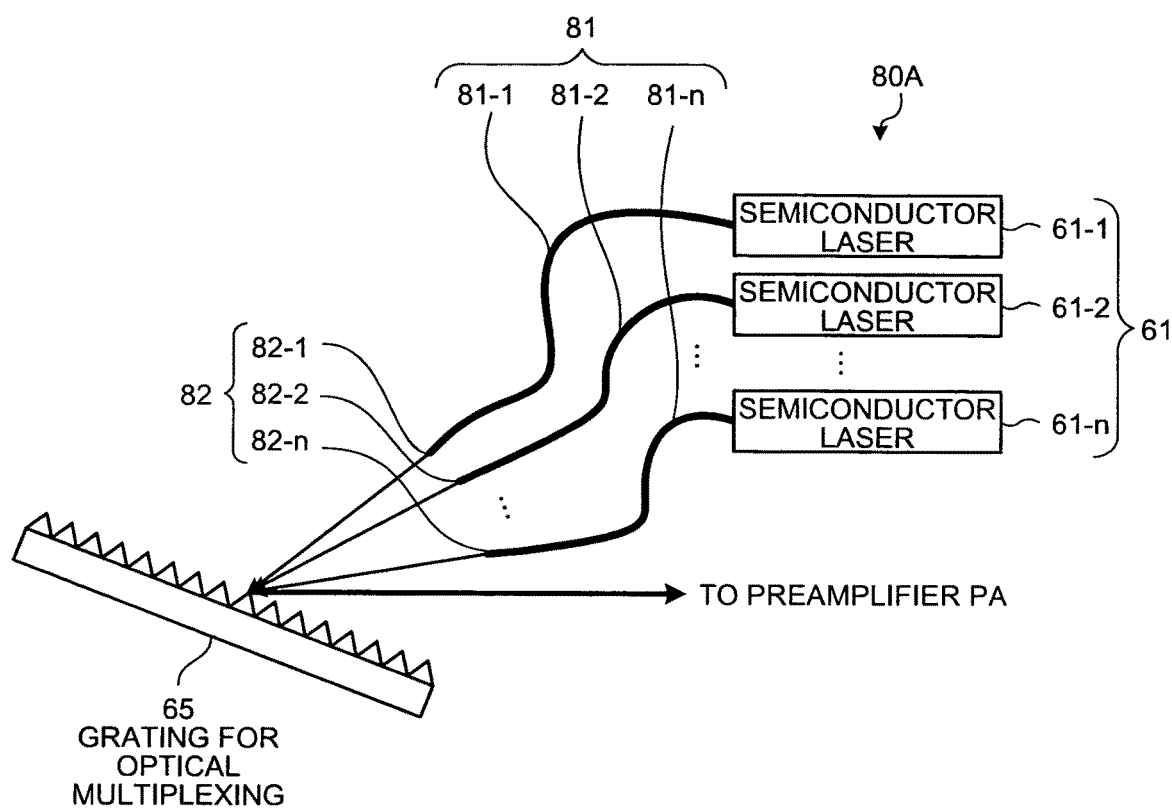
FIG. 28 is a schematic diagram showing a structure of a laser apparatus used for an extreme ultraviolet light source apparatus according to a thirteenth embodiment of the present invention.

FIG. 28 is a schematic diagram showing a structure of a laser apparatus 80A used for an extreme ultraviolet light source apparatus according to the thirteenth embodiment of the present invention. The laser apparatus 80A has the same structure as the laser apparatus 80 shown in FIG. 27, but the optical combining grating 65 is arranged to the state of Littrow arrangement or an approximate Littrow arrangement.

By arranging the optical combining grating 65 to the state of the Littrow arrangement or the an approximate Littrow arrangement, it is possible to increase wavelength-dispersion with respect to an entering laser light. Thereby, it is possible to locate the output ends 82 of the pigtails 81 more closely to the optical combining grating 65, as a result of which, downsizing of the laser apparatus 80A can be made possible. Since the rest of the structures, operations and effects of the laser apparatus and the extreme ultraviolet light source apparatus are the same as those of the laser apparatuses and the extreme ultraviolet light source apparatuses according to the above-mentioned embodiments, a detailed description thereof will be omitted.

Fourteenth Embodiment

Next, a fourteenth embodiment of the present invention will be described in detail. In the laser apparatus 60B according to the alternate example 9-2 of the ninth embodiment, the output edges of the semiconductor lasers 61 are used as the output ends of the laser lights which are to be combined. Thereby, in the alternate example 9-2, the semiconductor lasers 61-1 to 61-1 should be arranged so that the output directions of laser lights are arrayed in parallel. On the other hand, in the fourteenth embodiment, output ends of pigtails are used as the output ends of the laser lights which are to be combined. By this arrangement, in the fourteenth embodiment, it is not necessary to arrange the semiconductor laser 61 in such a way that the output directions of laser lights are arrayed in parallel. As a result, it is possible to downsize the laser apparatus. In the following, the same reference numbers will be used for the structural elements that are the same as the first embodiment, and redundant explanations of those structural elements will be omitted.

Figure 29:
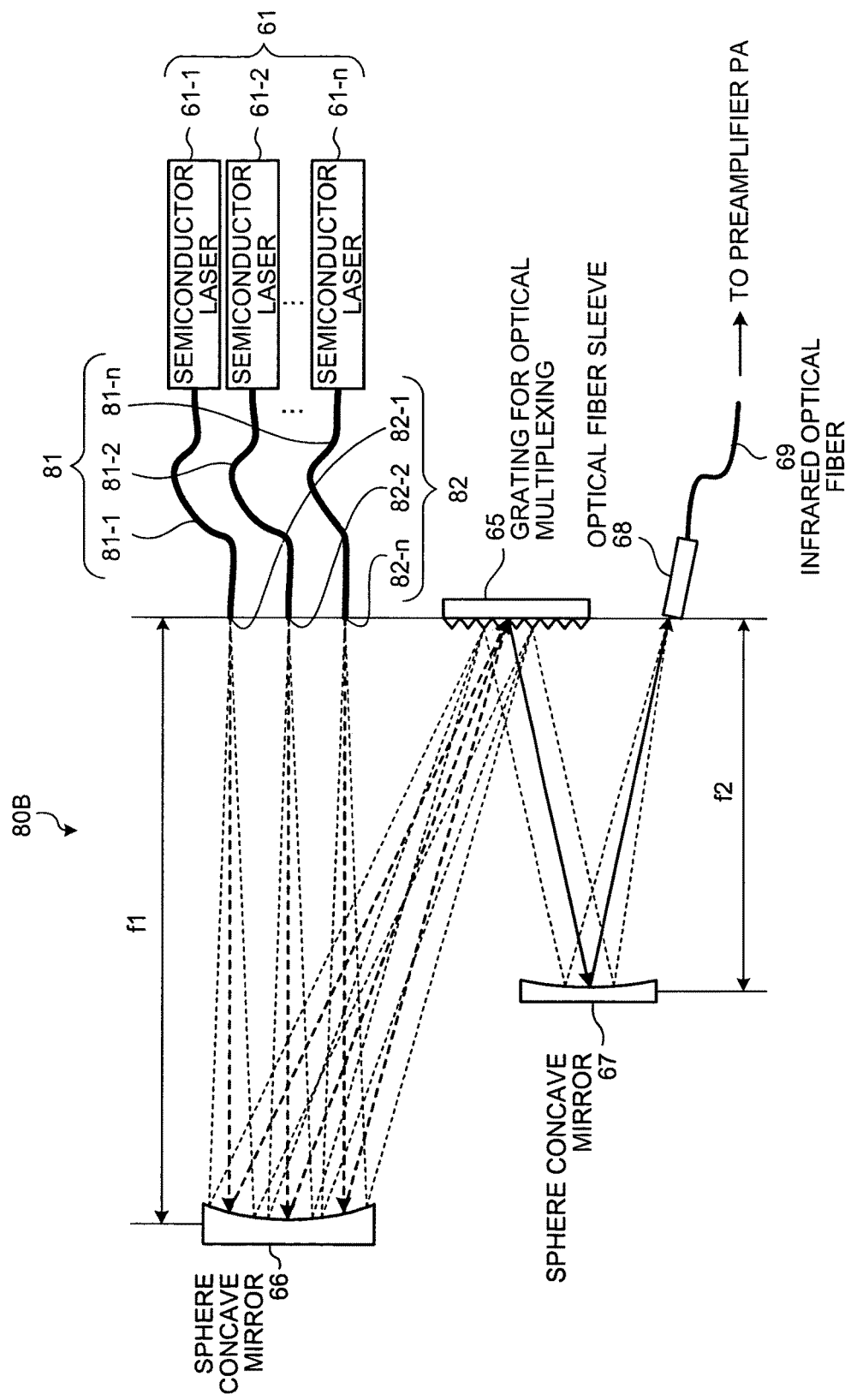
FIG. 29 is a schematic diagram showing a structure of a laser apparatus used for an extreme ultraviolet light source apparatus according to a fourteenth embodiment of the present invention.

FIG. 29 is a schematic diagram showing a structure of a laser apparatus 80B used for an extreme ultraviolet light source apparatus according to the fourteenth embodiment of the present invention. As with the laser apparatus 60B shown in FIG. 21, the laser apparatus 80B has a plurality of semiconductor lasers 61-1 to 61-n (61), the optical combining grating 65, the sphere concave mirrors 66 and 67, and the infrared optical fiber 69 having the optical fiber sleeve 68. Moreover, the laser apparatus 80B has the same structure as the laser apparatus 60B, but further has the pigtails 81-1 to 81-n (81) waveguiding the laser lights from the semiconductor lasers 61-1 to 61-n (61), respectively.

In addition, in this embodiment, a distance from each of the output ends of the laser lights to the sphere concave mirror 66 is assumed as 'f1', and a distance from the sphere concave mirror 67 to the optical fiber sleeve 68 is assumed as 'f2'. However, as long as 'f1' is set to such a distance that makes the sphere concave mirror 66 able to reflect and collimate the laser lights outputted from the output ends 82 of the pigtails 81, and as long as 'f2' is set to such a distance that makes the sphere concave mirror 67 able to collect the collimate light from the optical combining grating 65 to the optical fiber sleeve 68, it is possible to variously change the structure as in the case of the above-mentioned embodiments including the alternate example 9-2.

As with the case of the above-mentioned twelfth embodiment, one ends of the pigtails 81-1 to 81-n are attached to the output edges of the semiconductor lasers 61-1 to 61-n, respectively. Accordingly, the laser lights outputted from the semiconductor lasers 61 enter from one ends of the pigtails 81, propagate inside the pigtails 81, respectively, and then are emitted from the other ends 82-1 to 82-n (82) of the pigtails 81, respectively.

The output ends 82-1 to 82-n (82) are arranged along side at the position departed from the sphere concave mirror 66 with a distance f1. Here, as mentioned above, the size (diameter, for instance) of each output end 82 is sufficiently small as compared to the size of each semiconductor laser 61. Therefore, it is possible to locate the output ends 82 of the pigtails 81 more closely to the optical combining grating 65. Thereby, it is possible to narrow the diameter of a bundle of the laser lights outputted from all of the output ends 82. Thus, by narrowing the diameter of the bundle of the laser lights, it is possible to downsize the sphere concave mirror 66 (especially the reflecting surface), and therefore, it is possible to further downsize the laser apparatus 80B.

Moreover, along with the downsize of the sphere concave mirror 66, the distance f1 can be made short, as a result of which, a spot diameter of each laser light becomes narrower. Thereby, it is possible to not only downsize the optical combining grating 65 (especially the diffractive surface) and the sphere concave mirror 67 (especially the reflective surface), but also shorten the distance f2. Accordingly, it is possible to further downsize the laser apparatus 80B.

Furthermore, as mentioned above, the pigtails 81 can be bended. Therefore, it is possible to freely arrange locations of the semiconductor lasers 61. For such arrangement as mentioned, in the fourteenth embodiment, design freedom of the laser apparatus 80B can be enhanced. As a result, it is possible to downsize the laser apparatus 80B.

As with the case of the alternate example 9-2, the laser lights from the plurality of the semiconductor lasers 61-1 to 61-n enter the optical combining grating 65 with the incidence angles α1, α2, . . . , αn, respectively. That is, the output ends 82 of the pigtails 81 and the sphere concave mirror 66 are fixed so that the above-mentioned formulas (5-1) to (5-2) can be fulfilled. As a result, the optical combining grating 65 outputs all of the laser lights entering from the output ends 82 of the pigtails 81 with the diffraction angle β. Thereby, the laser lights outputted from the plurality of the semiconductor lasers 61 are combined.

As mentioned above, in the fourteenth embodiment, as with the case of the alternate example 9-2, the laser lights entering the optical combining grating 65 are collimate lights. Therefore, it is possible to improve precision of diffraction by the optical combining grating 65.

Moreover, in the fourteenth embodiment, because the output ends 82 of the pigtails 81 are used as the output ends of the laser lights from the semiconductor lasers 61, it is possible to improve quality of special coherence of optical combining wave surfaces by downsizing the diameters of the output ends 82. Furthermore, in the fourteenth embodiment, as with the case of the above-mentioned other embodiments, the laser light to be entered into the infrared optical fiber 69 is a combined light. Therefore, by monitoring intensity per wavelength of the laser lights outputted from the infrared optical fibers 69, it is possible to easily detect as to whether or not the laser lights are accurately combined. Since the rest of the structures, operations and effects of the laser apparatus and the extreme ultraviolet light source apparatus are the same as those of the laser apparatuses and the extreme ultraviolet light source apparatuses according to the above-mentioned embodiments, a detailed description thereof will be omitted.

Fifteenth Embodiment

Figure 30:
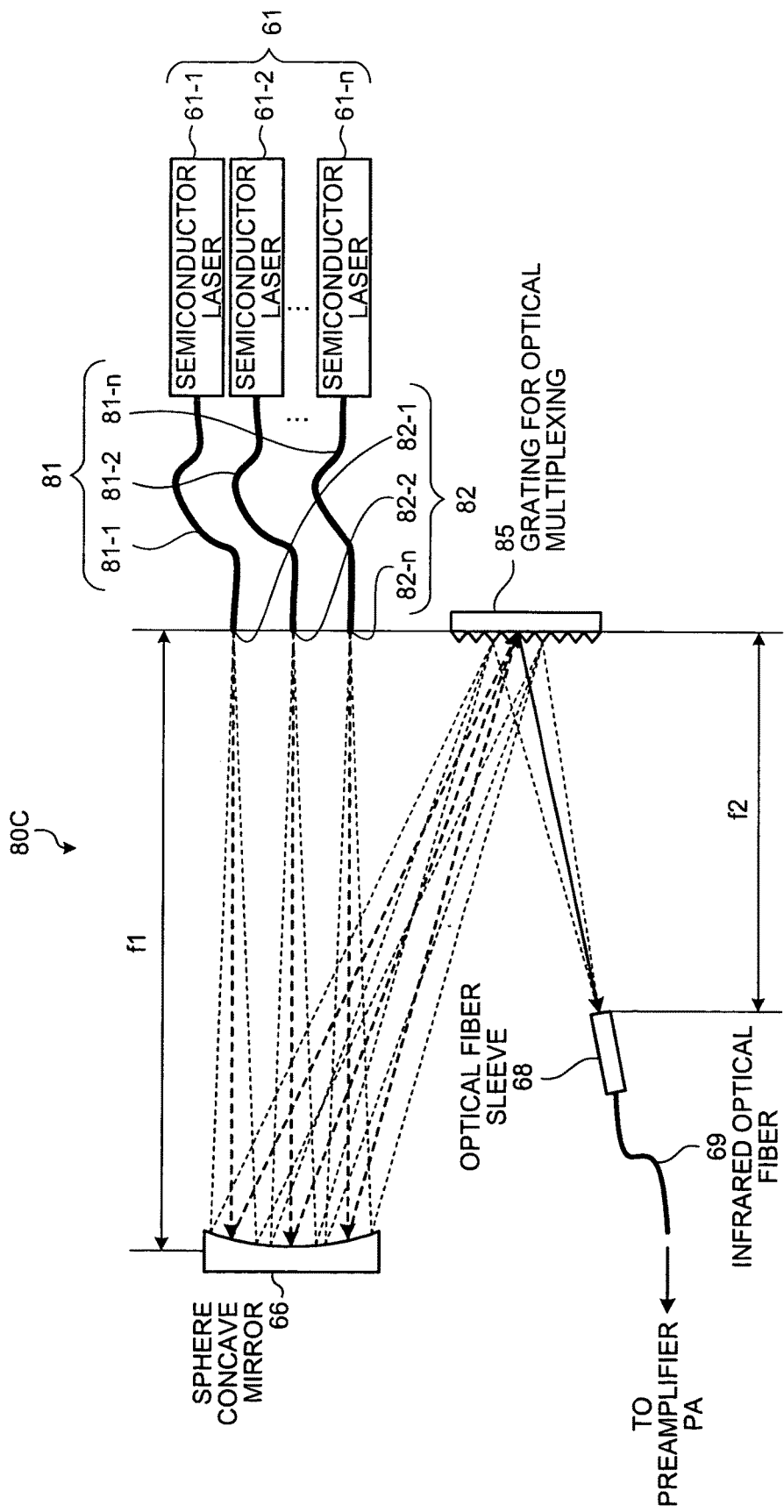
FIG. 30 is a schematic diagram showing a structure of a laser apparatus used for an extreme ultraviolet light source apparatus according to a fifteenth embodiment of the present invention.

Next, a fifteenth embodiment of the present invention will be described in detail with reference to the accompanying drawings. FIG. 30 is a schematic diagram showing a structure of a laser apparatus 80C used for an extreme ultraviolet light source apparatus according to the fifteenth embodiment of the present invention. In the laser apparatus 8013 according to the fourteenth embodiment, as shown in FIG. 29, the combined light from the optical combining grating 65 is collected using the sphere concave mirror 67. On the other hand, in a laser apparatus 80C according to the fifteenth embodiment, as is obvious by comparing FIGS. 30 and 29, a concave type optical combining grating 85 with which a laser light is collectable used as the optical combining grating. Thereby, it is possible to eliminate the sphere concave mirror 67 for the use of collecting the combined light. Therefore, it is possible to further downsize the laser apparatus 80C.

Since the rest of the structures, operations and effects of the laser apparatus and the extreme ultraviolet light source apparatus are the same as those of the laser apparatuses and the extreme ultraviolet light source apparatuses according to the above-mentioned embodiments, the same reference numbers will be used for referring to the structural elements that are the same as in the above-mentioned embodiments, and a redundant description thereof will be omitted.

In addition, in the first to fifteenth embodiments as mentioned above, one preamplifier PA and one main amplifier MA are used. However, it is not limited to such arrangement. It is also possible to have more than one preamplifiers and more than one main amplifiers arranged in series, respectively.

Moreover, in the first to ninth and the eleventh to fifteenth embodiments as mentioned above, the pulse laser apparatus has been brought up as an example of a laser apparatus. However, it is not limited to such arrangement. A CW laser apparatus outputting a CW laser light can also be used.

In addition, the above-mentioned embodiments and the alternate examples can be arbitrarily combined with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser apparatus comprising:
a master oscillator including a plurality of quantum cascade lasers each of which outputs one or more longitudinal-mode laser lights;
an optical combiner configured for combining the longitudinal-mode laser lights from the plurality of the quantum cascade lasers to output a combined longitudinal-mode laser light;
an amplifier with a molecular gas as an amplifying medium amplifying the combined longitudinal-mode laser light of which wavelength is included in one of amplifiable lines;
at least one pair of high-reflective mirrors arranged so as to sandwich an amplifiable region of the amplifier in order to make the longitudinal-mode laser lights outputted from the master oscillator shuttle in the amplifiable region more than once;
a plurality of Peltier elements each of which is configured for contacting corresponding one of the quantum cascade lasers; and
a controller configured for controlling at least one of the Peltier elements at a temperature different from a temperature of another Peltier element so that at least a part of wavelength of the longitudinal-mode laser light from each quantum cascade laser is included in one of the amplifiable lines.

2. The laser apparatus according to claim 1, wherein the amplifier with the molecular gas as the amplifying medium is a one or more stage $CO_2$ gas laser.

3. The laser apparatus according to claim 1, wherein the controller is configured to control a time waveform of a longitudinal-mode laser light outputted from the master oscillator by controlling a current waveform to be supplied to the master oscillator.

4. The laser apparatus according to claim 1, wherein
the master oscillator has a plurality of optical fibers which waveguide the longitudinal-mode laser lights outputted from the one or more quantum cascade lasers, and
the optical combiner combines the longitudinal-mode laser lights each of which is outputted from an output end of each of the optical fibers.

5. The laser apparatus according to claim 4, wherein
the optical combiner is a grating which distributes wavelength of incident light,
output ends of the optical fibers are located so that the plurality of longitudinal-mode laser lights from the plurality of the quantum cascade lasers are overlapped at a predetermined position, and
the grating is located at the predetermined position so that diffraction angles of the longitudinal-mode laser lights from the plurality of the quantum cascade lasers correspond with each other.

6. The laser apparatus according to claim 5, wherein the grating is arranged in a Littrow arrangement with respect to the longitudinal-mode laser lights from the plurality of the quantum cascade lasers.

7. The laser apparatus according to claim 4, wherein
the master oscillator has a concave mirror which reflects the longitudinal-mode laser lights outputted from the output ends of the optical fibers as collimated lights, respectively, and overlaps the collimated lights at a predetermined position,
the optical combiner is a grating which is able to distribute wavelength of incident light, and
the grating is located at the predetermined position so that diffraction angles of the longitudinal-mode laser lights correspond with each other.

8. The laser apparatus according to claim 7, wherein
the grating is a concave-type grating which diffracts the collimated lights so that the collimated lights are collected.

9. An extreme ultraviolet light source apparatus comprising:
a laser apparatus having:
a master oscillator including a plurality of semiconductor lasers each of which outputs one or more longitudinal-mode laser lights;
an amplifier with a molecular gas as an amplifying medium amplifying a longitudinal ode laser light of which wavelength is included in one of amplifiable lines;
at least one pair of high-reflective mirrors arranged so as to sandwich an amplifiable region of the amplifier in order to make the longitudinal-mode laser lights outputted from the master oscillator shuttle in the amplifiable region more than once;
a plurality of Peltier elements each of which is configured for contacting corresponding one of the semiconductor lasers; and
a controller configured for controlling at least one of the Peltier elements at a temperature different from a temperature of another Peltier element so that at least a part of wavelength of the longitudinal-mode laser light outputted from each semiconductor laser is included in one of the amplifiable lines, the laser apparatus being used as a driver laser, wherein
the laser apparatus irradiates a target material with a laser light for generating plasma, and the extreme ultraviolet light emitted from the plasma is focused by an EUV collector mirror and outputted from the ultraviolet light source apparatus.

10. The laser apparatus according to claim 1, further comprising:
a regenerative amplifier including at least one of a resonator mirror, an EO Pockels cell, a polarized beam splitter, a laser amplifier and a λ/4 plate.

* * * * *